(12) United States Patent
Chang et al.

(10) Patent No.: US 12,300,718 B2
(45) Date of Patent: May 13, 2025

(54) SEMICONDUCTOR DEVICES WITH COUNTER-DOPED NANOSTRUCTURES

(71) Applicant: Taiwan Semiconductor Manufacturing Company, Ltd., Hsinchu (TW)

(72) Inventors: Hsiao-Chun Chang, Hsinchu (TW); Guan-Jie Shen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 499 days.

(21) Appl. No.: 17/455,240

(22) Filed: Nov. 17, 2021

(65) Prior Publication Data

US 2022/0352311 A1 Nov. 3, 2022

Related U.S. Application Data

(60) Provisional application No. 63/181,672, filed on Apr. 29, 2021.

(51) Int. Cl.
| | |
|---|---|
| *H01L 29/06* | (2006.01) |
| *H01L 29/423* | (2006.01) |
| *H01L 29/66* | (2006.01) |
| *H01L 29/786* | (2006.01) |

(52) U.S. Cl.
CPC .... *H01L 29/0673* (2013.01); *H01L 29/42392* (2013.01); *H01L 29/66439* (2013.01); *H01L 29/66553* (2013.01); *H01L 29/6656* (2013.01); *H01L 29/66742* (2013.01); *H01L 29/78618* (2013.01)

(58) Field of Classification Search
None
See application file for complete search history.

(56) References Cited

U.S. PATENT DOCUMENTS

| | | | |
|---|---|---|---|
| 9,991,352 B1 * | 6/2018 | Frougier | H01L 29/42364 |
| 10,243,054 B1 * | 3/2019 | Cheng | H01L 27/088 |
| 11,355,494 B1 * | 6/2022 | Yang | H01L 29/0847 |

(Continued)

FOREIGN PATENT DOCUMENTS

CN 111435641 A * 7/2020 ............. B82Y 10/00

*Primary Examiner* — Scott B Geyer
(74) *Attorney, Agent, or Firm* — Sterne, Kessler, Goldstein & Fox P.L.L.C.

(57) ABSTRACT

The present disclosure describes a semiconductor device with counter-doped nanostructures and a method for forming the semiconductor device. The method includes forming a fin structure on a substrate, the fin structure including one or more first-type nanostructures and one or more second-type nanostructures. The method further includes forming a polysilicon structure over the fin structure and forming a source/drain (S/D) region on a portion of the fin structure and adjacent the polysilicon structure, the S/D region including a first dopant. The method further includes doping the one or more second-type nanostructures with a second dopant via a space released by the polysilicon structure and the one or more first-type nanostructures, where the second dopant is opposite to the first dopant. The method further includes replacing portions of the one or more doped second-type nanostructures with additional second-type nanostructures.

20 Claims, 23 Drawing Sheets

(56) References Cited

U.S. PATENT DOCUMENTS

| | | | | |
|---|---|---|---|---|
| 2014/0001441 | A1* | 1/2014 | Kim | H01L 29/66553 257/29 |
| 2015/0295036 | A1* | 10/2015 | Hong | H01L 29/0847 438/149 |
| 2015/0372115 | A1* | 12/2015 | Koh | H01L 29/66545 438/301 |
| 2015/0372119 | A1* | 12/2015 | Zhang | H01L 21/265 438/268 |
| 2016/0252478 | A1* | 9/2016 | Lee | H01L 29/0649 257/253 |
| 2016/0276494 | A1* | 9/2016 | Barraud | H01L 29/78654 |
| 2017/0186846 | A1* | 6/2017 | Badaroglu | H01L 29/66795 |
| 2017/0236901 | A1* | 8/2017 | Choi | H01L 29/786 257/347 |
| 2018/0219064 | A1* | 8/2018 | Cheng | B82Y 10/00 |
| 2018/0253568 | A1* | 9/2018 | Cheng | H01L 29/0676 |
| 2019/0067447 | A1* | 2/2019 | Zhou | H01L 21/31144 |
| 2019/0237546 | A1* | 8/2019 | Huang | H01L 21/26586 |
| 2019/0326396 | A1* | 10/2019 | Cheng | H01L 29/78696 |
| 2020/0020690 | A1* | 1/2020 | Ando | H01L 21/28088 |
| 2020/0105929 | A1* | 4/2020 | Zhang | H01L 29/1033 |
| 2020/0152767 | A1* | 5/2020 | Armstrong | H01L 29/0653 |
| 2020/0357931 | A1* | 11/2020 | Lee | H01L 29/0673 |
| 2021/0043727 | A1* | 2/2021 | Frougier | H01L 29/66553 |
| 2021/0066292 | A1* | 3/2021 | Xiao | H01L 21/02532 |
| 2021/0118882 | A1* | 4/2021 | Tsai | H01L 29/66537 |
| 2021/0135011 | A1* | 5/2021 | Ju | H01L 29/7849 |
| 2021/0184032 | A1* | 6/2021 | Nidhi | H01L 29/0878 |
| 2021/0184045 | A1* | 6/2021 | Ramaswamy | H01L 21/26586 |
| 2021/0217846 | A1* | 7/2021 | Hashemi | H01L 29/42376 |
| 2021/0233998 | A1* | 7/2021 | Tomida | H01L 29/1079 |
| 2021/0273078 | A1* | 9/2021 | Wu | H01L 29/66553 |
| 2021/0296323 | A1* | 9/2021 | Zheng | H01L 29/66545 |
| 2021/0343858 | A1* | 11/2021 | Wang | H01L 29/66439 |
| 2021/0367032 | A1* | 11/2021 | Chen | H01L 29/42392 |
| 2021/0408285 | A1* | 12/2021 | Hickey | H01L 29/165 |
| 2022/0052155 | A1* | 2/2022 | Liaw | H01L 29/66545 |
| 2022/0123152 | A1* | 4/2022 | Abhijith | H01L 29/775 |
| 2022/0302278 | A1* | 9/2022 | Cheng | H01L 29/456 |
| 2022/0416047 | A1* | 12/2022 | Zhu | H01L 29/42392 |

* cited by examiner

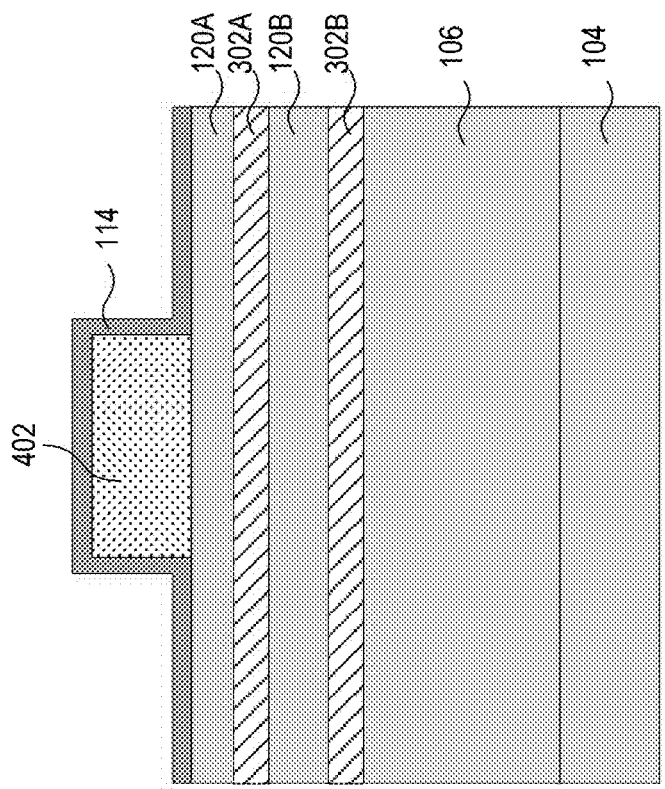
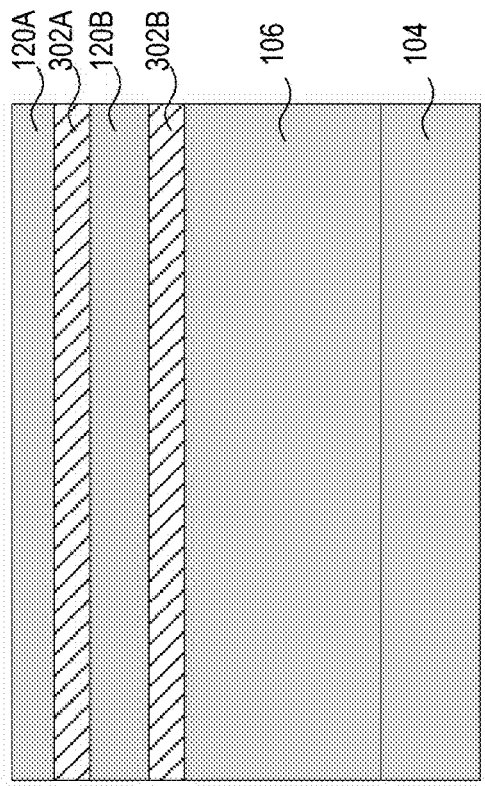
FIG. 4
FIG. 3

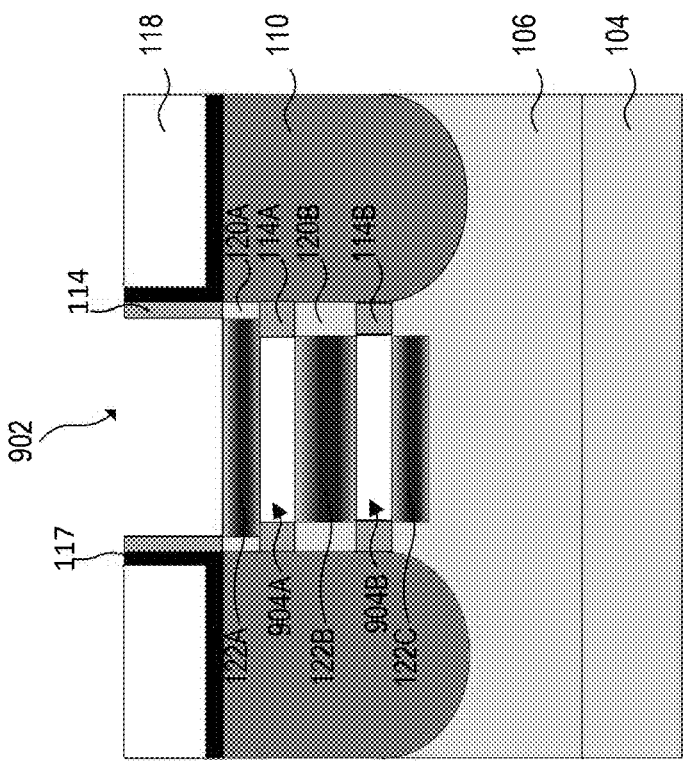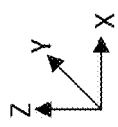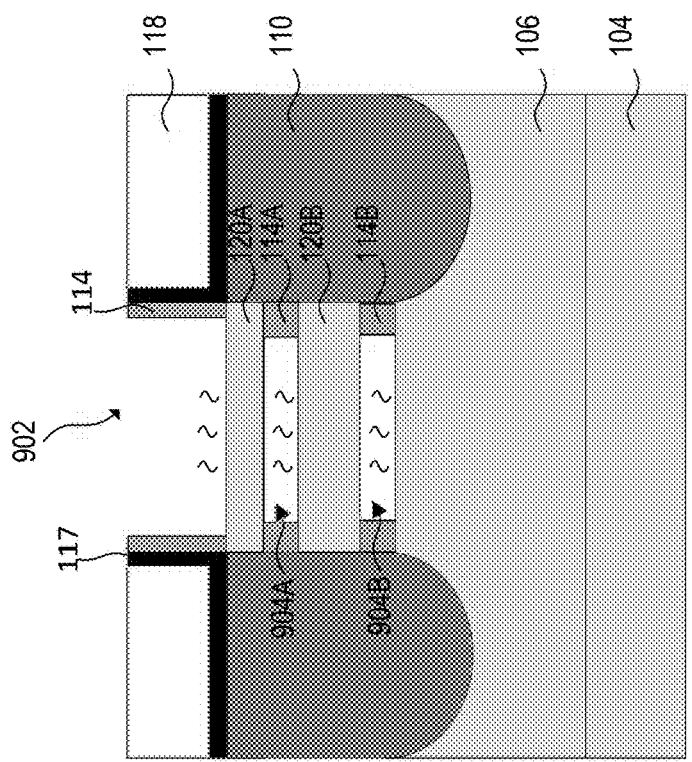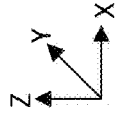

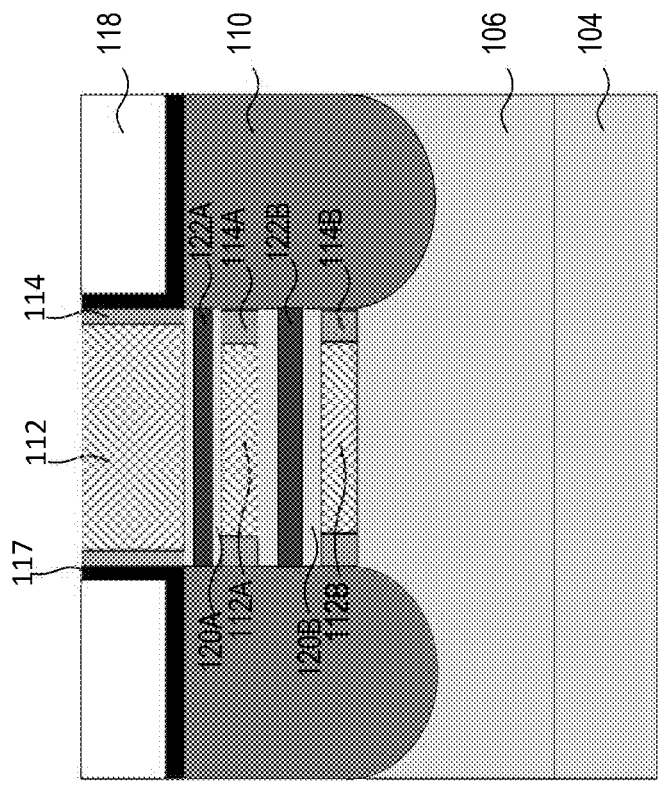
FIG. 27
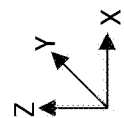

SEMICONDUCTOR DEVICES WITH COUNTER-DOPED NANOSTRUCTURES

CROSS-REFERENCE TO RELATED APPLICATION

This application claims the benefit of U.S. Provisional Patent Application No. 63/181,672, filed on Apr. 29, 2021 and titled "The Novel Center-Doped Gate-All-Around Structure for Leakage Reduction," the disclosure of which is incorporated by reference herein in its entirety.

BACKGROUND

With advances in semiconductor technology, there have been increasing demands for higher storage capacity, faster processing systems, higher performance, and lower costs. To meet these demands, the semiconductor industry continues to scale down the dimensions of semiconductor devices with three-dimensional transistors, such as gate-all-around (GAA) field effect transistors (FETs) and fin field effect transistors (finFETs).

BRIEF DESCRIPTION OF THE DRAWINGS

Aspects of the present disclosure are best understood from the following detailed description when read with the accompanying figures.

FIGS. 3-13 illustrate cross-sectional views of a semiconductor device with counter-doped nanostructures at various stages of its fabrication process, in accordance with some embodiments.

FIGS. 15-27 illustrate cross-sectional views of a semiconductor device with counter-doped nanostructures at various stages of its fabrication process, in accordance with some embodiments.

DETAILED DESCRIPTION

Figure 1A:
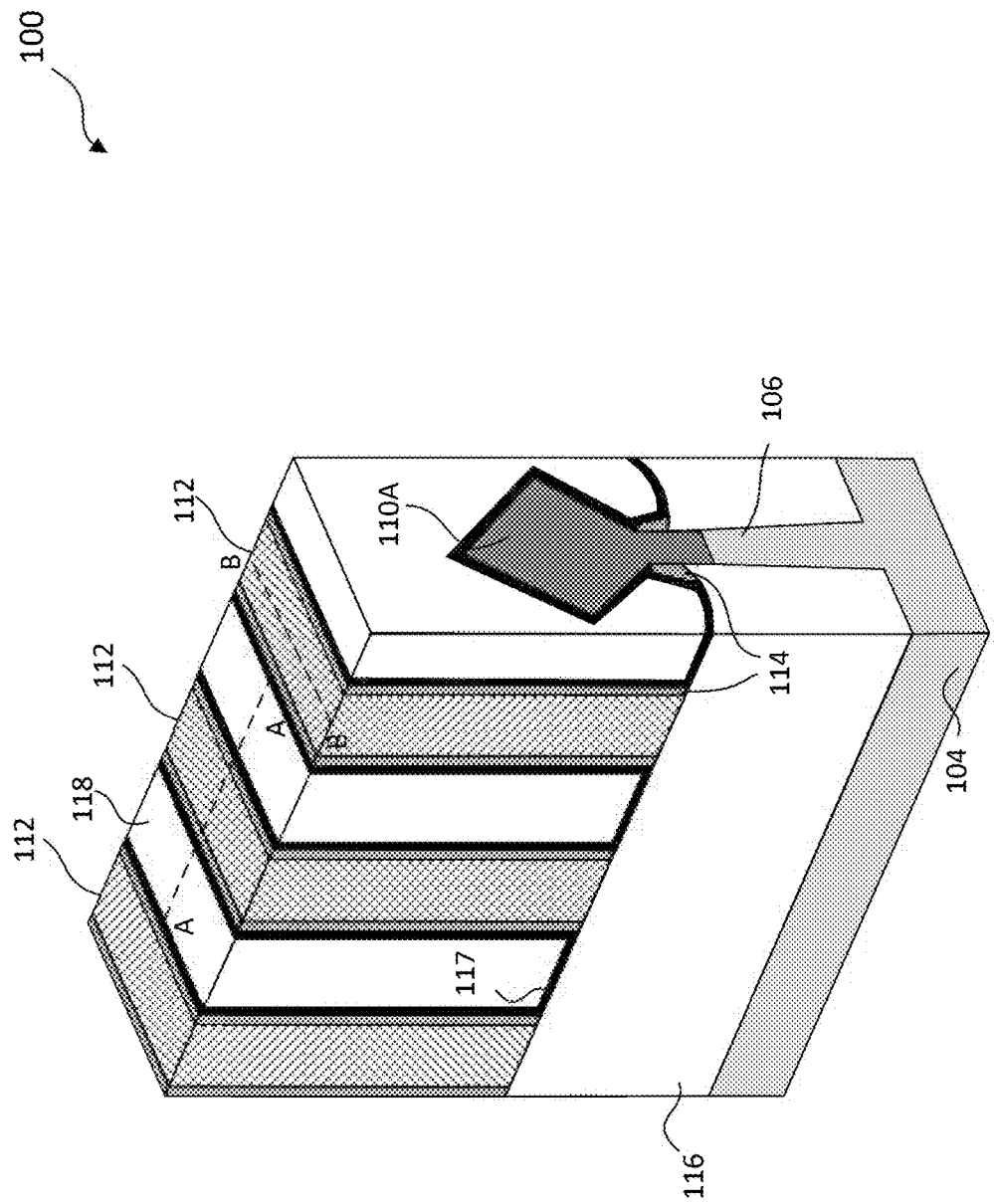
FIG. 1A illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., $\pm 1\%$, $\pm 2\%$, $\pm 3\%$, $\pm 4\%$, $\pm 5\%$ of the value). These values are merely examples and are not intended to be limiting. The terms "about" and "substantially" can refer to a percentage of the values as interpreted by those skilled in relevant art(s) in light of the teachings herein.

The discussion of elements in FIGS. 1A-1E, 3-13, 15-27, and 29-34 with the same annotations applies to each other, unless mentioned otherwise.

As the semiconductor industry continues to scale down the dimensions of semiconductor devices, circuit complexity has increased at all device levels. Gate-all-around (GAA) field effect transistors (FETs) and fin field effect transistors (finFETs) increase device density and improve device performance. GAA FETs and finFETs include a pair of source/drain (S/D) regions formed on opposite sides of a channel region. Scaling down the dimensions of semiconductor devices can increase leakage current between S/D regions. For example, beyond the 5 nm technology node or the 3 nm technology node, increased S/D tunneling can increase leakage current and cause device failure. Short channel effects (SCEs) can also be one of the reasons for device failure. Semiconductor devices implementing nanostructures, such as nanowires and nanosheets, are potential candidates to overcome the SCEs. Among them, GAA FETs can reduce SCEs and enhance carrier mobility, which in turn improve device performance. However, it has become increasingly challenging to further reduce leakage paths between the pair of S/D regions near the center of the nanostructures due to gate control. Leakage current flowing through the center of the nanostructures can impact off current and reduce device performance.

The present disclosure provides example FET devices (e.g., GAA FETs, finFETs, horizontal or vertical GAA finFETs, or planar FETs) with counter-doped nanostructures in a semiconductor device and/or in an integrated circuit (IC) and example methods for fabricating the same. In some embodiments, S/D regions can be formed on opposite sides of a channel region including first-type nanostructures and second-type nanostructures. The second-type nanostructures can have the same semiconductor material, such as silicon (Si) and silicon germanium (SiGe), as the S/D regions. The first-type nanostructures can have different semiconductor materials from the second-type nanostructures and the S/D regions. For example, if the second-type nanostructures and the S/D regions include Si, the first-type nanostructures can include SiGe, and vice versa. After first-type nanostructures and a sacrificial polysilicon are released, a plasma doping process can be performed to dope the fin structure and second-type nanostructures via a space released by the first-type nanostructures and the sacrificial polysilicon. After the plasma doping, the second-type nanostructures can have different dopants from the dopants in the S/D regions. For example, if the S/D regions have n-type dopants, such as phosphorus (P) and arsenic (As), the second-type nanostructures can have p-type dopants, such as boron (B), indium (In), aluminum (Al), and gallium (Ga), and vice versa. After the plasma doping, portions of the second-type nanostructures can be removed by wet etching. Additional second-type nanostructures can be intrinsic and can be epitaxially grown where the portions of the second-type nanostructures are removed. Therefore, counter-doped portions of the second-type nanostructures can be sandwiched by intrinsic second-type nanostructures. The counter-doped portions of the second-type nanostructures can reduce leakage current. In some embodiments, all portions of second-type nanostructures are not counter-doped because such counter-doping would degrade device performance (e.g., device current).

In some embodiments, the counter-doped portions of the second-type nanostructures can be formed during formation of the fin structure. A first-type nanostructure can be formed on a substrate. An intrinsic first portion of second-type nanostructure can be formed on the first-type nanostructure. An intermediate nanostructure can be formed with a dopant on the first portion. The dopant can be thermally driven (e.g., by annealing) into a top part of the first portion to form a doped second portion of second-type nanostructure. The intermediate nanostructure can then be removed and an intrinsic third portion of second-type nanostructure can be formed on the second portion. S/D regions with an opposite dopant to that of the second portion can be formed on portions of the fin structure, using the second-type nanostructure as a channel region. In some embodiments, after the intrinsic first portion of second-type nanostructure is formed on the first-type nanostructure, a doped second portion of second-type nanostructure can be formed directly on the first portion, and an intrinsic third portion of second-type nanostructure can be formed directly on the second portion. In some embodiments, there is no intermediate nanostructure, and annealing and removal of the intermediate nanostructure are not needed. Both methods can form a second-type nanostructure with a counter-doped portion to reduce leakage current without degrading device current. Both methods can be repeated to form multiple second-type nanostructures.

Figure 1C:
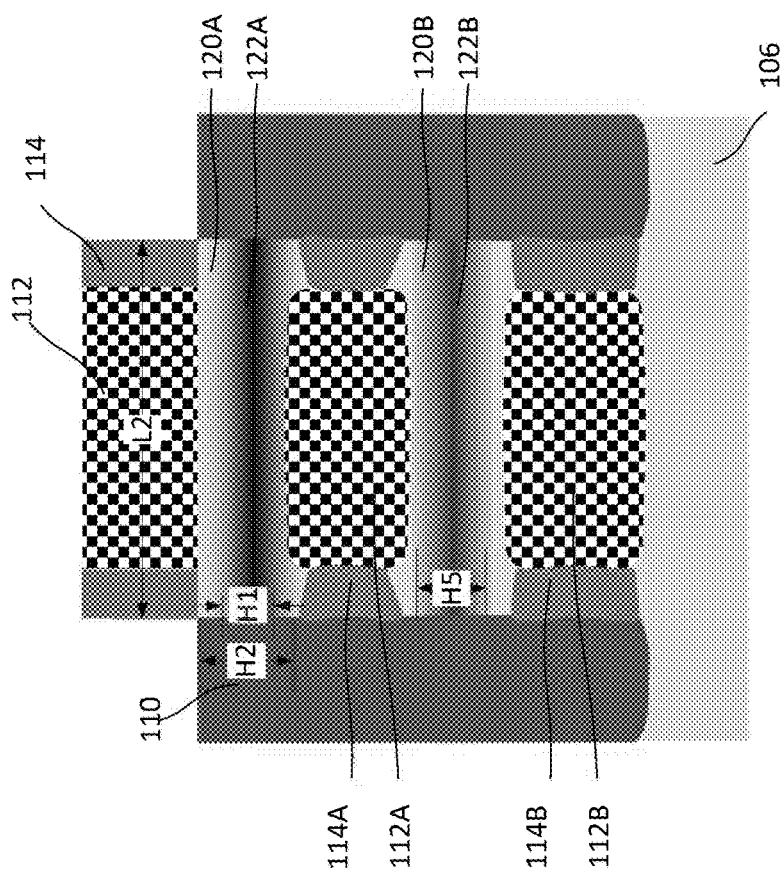
FIGS. 1B-1E illustrate cross-sectional views of a semiconductor device with counter-doped nanostructures, in accordance with some embodiments.
Figure 1B:
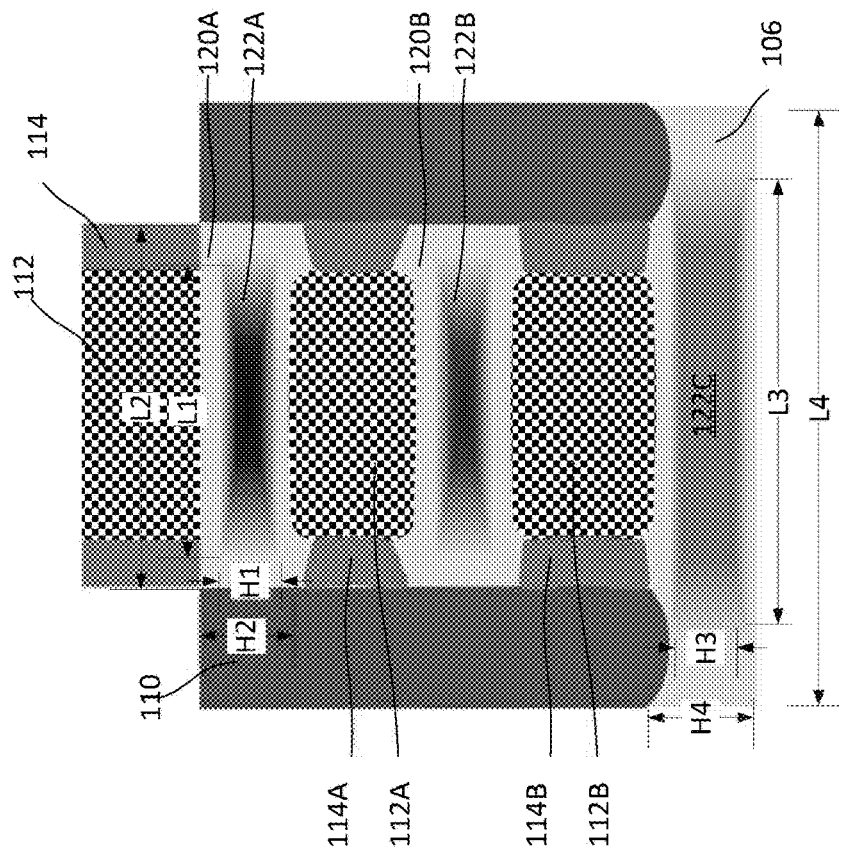
Figure 1E:
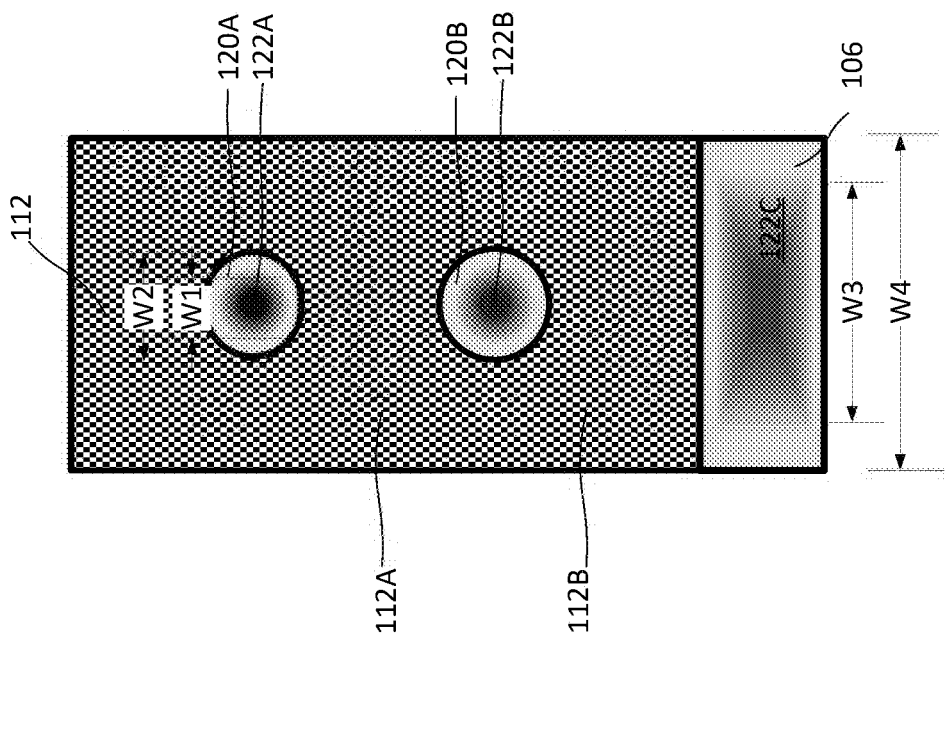
Figure 1D:
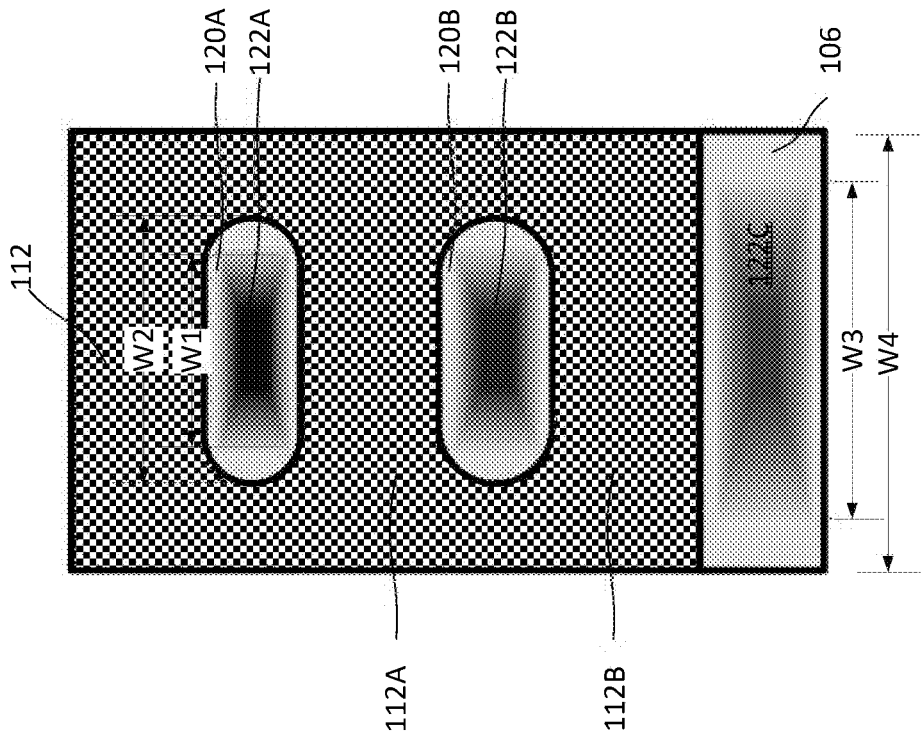

According to some embodiments, FIG. 1A illustrates an isometric view of a FET 100. In some embodiments, FET 100 can represent a finFET 100 or a GAA FET 100. In some embodiments, FET 100 can represent n-type FET 100 (NFET 100) or p-type FET 100 (PFET 100) and the discussion of FET 100 applies to both NFET 100 and PFET 100, unless mentioned otherwise. FIGS. 1B and 1C illustrate cross-sectional views of FET 100 along line A-A with additional structures that are not shown in FIG. 1A for simplicity. FIGS. 1D and 1E illustrate cross-sectional views of FET 100 along line B-B with additional structures that are not shown in FIG. 1A for simplicity. The discussion of elements in FIGS. 1A-1E with the same annotations applies to each other, unless mentioned otherwise.

Referring to FIGS. 1A-1E, FET 100 can include gate structures 112, 112A, and 112B (only gate structures 112 are visible in FIG. 1A; gate structures 112A and 112B visible in FIGS. 1B-1E) disposed on a fin structures 106 and S/D regions (only one S/D region 110A is visible in FIG. 1A; S/D regions 110 visible in FIGS. 1B and 1C) disposed on portions of fin structures 106 that are not covered by gate structures 112. FET 100 can further include gate spacers 114 and shallow trench isolation (STI) regions 116. FET 100 can further include etch stop layers (ESLs) 117, and interlayer dielectric (ILD) layers 118. ILD layers 118 can be disposed on ESLs 117. Referring to FIGS. 1B and 1C, FET 100 can further include inner spacers 114A and 114B. In some embodiments, gate spacers 114, inner spacers 114A and 114B, STI regions 116, ESLs 117, and ILD layers 118 can include an insulating material, such as silicon oxide ($SiO_x$), silicon nitride (SiN), silicon carbon nitride (SiCN), silicon oxycarbon nitride (SiOCN), and silicon germanium oxide ($SiGeO_x$). In some embodiments, gate spacers 114 and inner spacers 114A and 114B can have a thickness of about 2 nm to about 9 nm for adequate electrical isolation of gate structures 112, 112A, and 112B from adjacent structures.

Referring to FIG. 1A, FET 100 can be formed on a substrate 104. There can be other FETs and/or structures (e.g., isolation structures) formed on substrate 104. Substrate 104 can be a semiconductor material, such as Si, germanium (Ge), SiGe, a silicon-on-insulator (SOI) structure, and a combination thereof. Further, substrate 104 can be doped with p-type dopants (e.g., B, In, Al, or Ga) or n-type dopants (e.g., P or As). In some embodiments, fin structures 106 can include a material similar to substrate 104 and extend along an X-axis.

Referring to FIGS. 1A-IE, in some embodiments, gate structures 112, 112A, and 112B can be multi-layered structures. The multi-layers of gate structures 112, 112A, and 112B are not shown for simplicity. Each of gate structures 112, 112A, and 112B can include an interfacial oxide (IO) layer, a high-k (HK) gate dielectric layer disposed on IO layer, and a conductive layer disposed on the HK gate dielectric layer. The IO layers can include $SiO_x$, $SiGeO_x$, or germanium oxide ($GeO_x$). The HK gate dielectric layers can include an HK dielectric material, such as hafnium oxide ($HfO_2$), titanium oxide ($TiO_2$), hafnium zirconium oxide (HfZrO), tantalum oxide ($Ta_2O_3$), hafnium silicate (HfSiO$_4$), zirconium oxide ($ZrO_2$), and zirconium silicate (ZrSiO$_2$). The conductive layers can be multi-layered structures. Each of the conductive layers can include a work function metal (WFM) layer disposed on the HK gate dielectric layer, and a gate metal fill layer on the WFM layer. In some embodiments, the WFM layers can include titanium aluminum (TiAl), titanium aluminum carbide (TiAlC), tantalum aluminum (TaAl), tantalum aluminum carbide (TaAlC), Al-doped titanium (Ti), Al-doped titanium nitride (TiN), Al-doped tantalum (Ta), Al-doped tantalum nitride (TaN), other suitable Al-based materials, or a combination thereof. In some embodiments, the WFM layers can include substantially Al-free (e.g., with no Al) Ti-based or Ta-based nitrides or alloys, such as TiN, titanium silicon nitride (TiSiN), titanium gold (Ti—Au) alloy, titanium copper (Ti—Cu) alloy, TaN, tantalum silicon nitride (TaSiN), tantalum gold (Ta—Au) alloy, tantalum copper (Ta—Cu), and a combination thereof. The gate metal fill layers can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

Referring to FIGS. 1A-IC, for NFET 100, each of S/D regions 110A and 110 can include an epitaxially-grown semiconductor material, such as Si and SiGe, and n-type dopants, such as P and other suitable n-type dopants. For PFET 100, each of S/D regions 110A and 110 can include an epitaxially-grown semiconductor material, such as Si and SiGe, and p-type dopants, such as B and other suitable p-type dopants. A dopant concentration can be in a range from about $1 \times 10^{20}$ to about $3 \times 10^{22}$ atoms/cm$^3$ in each of S/D regions 110A and 110.

Referring to FIGS. 1B-1E, in some embodiments, FET 100 can include second-type nanostructures 120A and 120B. Second-type nanostructures 120A and 120B can include a semiconductor material similar to or different from substrate 104. Second-type nanostructures 120A and 120B can include a semiconductor material, similar to fin structure 106 and S/D regions 110A and 110. In some embodiments, second-type nanostructures 120A and 120B can include Si, silicon arsenide (SiAs), silicon phosphide (SiP), silicon carbide (SiC), silicon carbon phosphide (SiCP), SiGe, silicon germanium boron (SiGeB), germanium boron (GeB), silicon germanium stannum boron (SiGeSnB), a III-V semiconductor compound, or other suitable semiconductor materials. Referring to FIG. 1D, second-type nanostructures 120A and 120B can be nanosheets. Referring to FIG. 1E, second-type nanostructures 120A and 120B can be nanowires. Second-type nanostructures 120A and 120B can have cross-sections of other geometric shapes, such as circular, elliptical, triangular, and polygonal shapes.

Referring to FIGS. 1B-1E, second-type nanostructures 120A and 120B can include counter-doped portions 122A and 122B. Referring to FIGS. 1B, 1D, and 1E, FET 100 can further include a counter-doped portion 122C in fin structure 106. Counter-doped portions 122A, 122B, and 122C can have an opposite dopant to that of S/D regions 110. For example, counter-doped portions 122A, 122B, and 122C can have a dopant from a group of elements that is different from the dopant of S/D regions 110. A concentration of the dopant in counter-doped portion 122A can be similar to or greater than a concentration of the dopant in counter-doped portion 122B. The concentration of the dopant in counter-doped portion 122B can be similar to or greater than a concentration of the dopant in counter-doped portion 122C. The difference in the concentration of the dopant in counter-doped portions 122A, 122B, and 122C can be due to the shadowing effect during the plasma doping process. In some embodiments, the concentration of the dopant in counter-doped portion 122A can be between about $0.5 \times 10^{12}$ and about $1.5 \times 10^{16}$ atoms/cm$^3$, between about $0.8 \times 10^{12}$ and about $1.2 \times 10^{16}$ atoms/cm$^3$, and between about $1 \times 10^{12}$ and about $1 \times 10^{16}$ atoms/cm$^3$. The concentration of the dopant in counter-doped portion 122B can be between about $0.5 \times 10^{12}$ and about $1.5 \times 10^{15}$ atoms/cm$^3$, between about $0.8 \times 10^{12}$ and about $1.2 \times 10^{15}$ atoms/cm$^3$, and between about $1 \times 10^{12}$ and about $1 \times 10^{15}$ atoms/cm$^3$. The concentration of the dopant in counter-doped portion 122C can have similar ranges as the concentration of the dopant in counter-doped portion 122B. If the concentration of the dopant in counter-doped portions 122A, 122B, and 122C is below about $0.5 \times 10^{12}$, the leakage reduction effect can be insufficient. For example, the leakage reduction effect can be considered insufficient if the leakage current exceeds a threshold amount. If the concentration of the dopant in counter-doped portion 122A is greater than about $1.5 \times 10^{16}$ or the concentration of the dopant in counter-doped portions 122B and 122C is greater than about $1.5 \times 10^{15}$, on current of FET 100 can be degraded. For example, on current of FET 100 can be too low. Referring to FIG. 1C, the concentration of the dopant in counter-doped portion 122A can be similar to or greater than the concentration of the dopant in counter-doped portion 122B. The difference in the concentration of the dopant in counter-doped portions 122A and 122B can be due to counter-doped portion 122B being exposed to longer anneal times than counter-doped portion 122A.

Referring to FIGS. 1B, 1D, and 1E, in some embodiments, counter-doped portions 122A, 122B, and 122C may not span an entire length or width of second-type nanostructures 120A and 120B and fin structure 106. For example, a ratio between length L1 of counter-doped portion 122A and length L2 of second-type nanostructure 120A, a ratio between length L3 of counter-doped portion 122C and length L4 of fin structure 106, a ratio between width W1 of counter-doped portion 122A and width W2 of second-type nanostructure 120A, and a ratio between width W3 of counter-doped portion 122C and width W4 of fin structure 106 can be between about 0.3 and about 0.9, between about 0.4 and about 0.8, and between about 0.5 and about 0.7. If the ratio L1/L2, L3/L4, W1/W2, or W3/W4 is below about 0.3, the leakage reduction effect can be insufficient. There is no criticality if the ratio L1/L2, L3/L4, W1/W2, or W3/W4 is greater than about 0.9. If the ratio L1/L2, L3/L4, W1/W2, or W3/W4 is greater than about 0.9 or closer to about 1, the leakage reduction effect can increase. However, the ratios L1/L2, L3/L4, W1/W2, and W3/W4 are limited by process because counter-doped portions 122A, 122B, and 122C are doped via a space released by the sacrificial polysilicon and the first-type nanostructures. Because of gate spacers 114 and inner spacers 114A and 114B, the dopants cannot reach the ends of second-type nanostructures 120A and 120B completely. As shown in FIG. 1C, in some embodiments, counter-doped portions 122A and 122B can span an entire length L2 of second-type nanostructures 120A and 120B. This can be achieved by a process of stacking counter-doped portions 122A and 122B on intrinsic portions of second-type nanostructures 120A and 120B. Whether counter-doped portions can span an entire length of second-type nanostructures depends on the different methods of forming the counter-doped portions, which are described below.

Referring to FIGS. 1B and 1C, counter-doped portions 122A, 122B, and 122C may not span an entire height of second-type nanostructures 120A and 120B and fin structure 106. For example, height H1 of counter-doped portion 122A, height H5 of counter-doped portion 122B, and height H3 of counter-doped portion 122C can be between about 0.5 nm and about 10 nm, between about 1 nm and about 7 nm, and between about 2 nm and about 5 nm. If H1, H3, or H5 is less than about 0.5 nm, the leakage reduction effect can be insufficient. If H1, H3, or H5 is greater than about 10 nm, on current can be degraded. A ratio between height H1 of counter-doped portion 122A and height H2 of second-type nanostructure 120A and a ratio between height H3 of counter-doped portion 122C and height H4 of fin structure 106 can be between about 0.3 and about 0.9, between about 0.4 and about 0.8, and between about 0.5 and about 0.7. If the ratio H1/H2 or H3/H4 is below about 0.3, the leakage reduction effect can be insufficient. If the ratio H1/H2 or H3/H4 is greater than about 0.9, on current can be degraded. Referring to FIG. 1B, in some embodiments, the height of counter-doped portion 122A can be similar to or greater than the height of counter-doped portions 122B and 122C. The difference in the height of counter-doped portions 122A, 122B, and 122C can be due to the shadowing effect during the plasma doping process. Referring to FIG. 1C, a ratio between height H5 of counter-doped portion 122B and height H1 of counter-doped portion 122A can be between about 1.2 and about 4. There is no criticality of the ratio H5/H1. The difference in H1 and H5 may not be a design difference, and the different ratios H5/H1 can be due to process variations. The difference in H1 and H5 can be due to counter-doped portion 122B being exposed to longer anneal times than counter-doped portion 122A. Because counter-doped portion 122B is formed first, counter-doped portion 122B is exposed to a second anneal when counter-doped portion 122A is formed. H5 can be larger than H1. If the second anneal temperature is higher or the second anneal time is longer, the ratio H5/H1 can be higher. If the second anneal temperature is lower or the second anneal time is shorter, the ratio H5/H1 can be lower.

Figure 2:
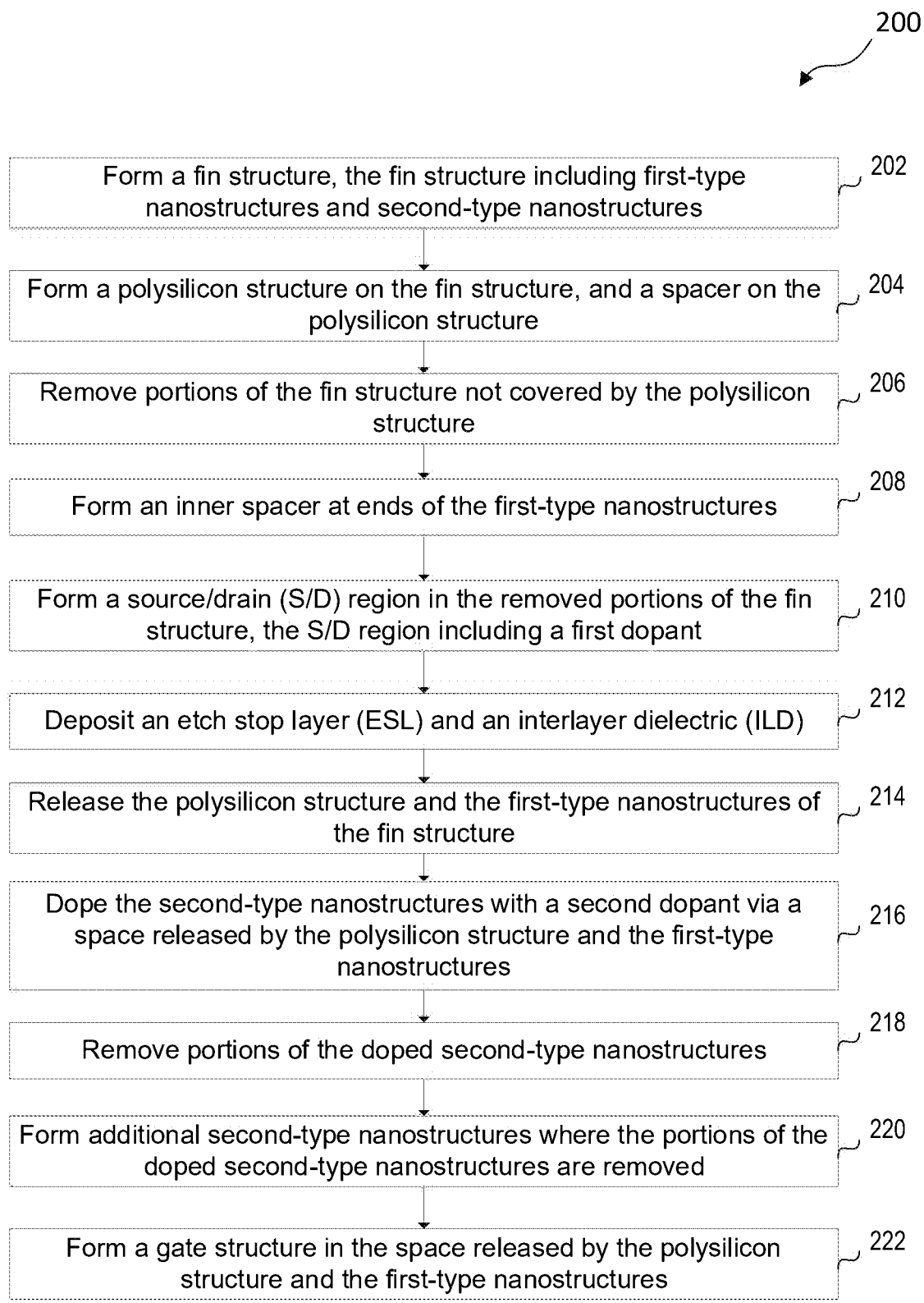
FIG. 2 is a flow diagram of a method for fabricating a semiconductor device with counter-doped nanostructures, in accordance with some embodiments.

According to some embodiments, FIG. 2 is a flow diagram describing a method 200 for fabricating FET 100, as shown in FIGS. 1A, 1B, 1D, and 1E. For illustrative purposes, the operations illustrated in FIG. 2 will be described with reference to the example fabrication process for fabricating FET 100 as illustrated in FIGS. 3-13. FIGS. 3-13 are cross-sectional views of FET 100 along line A-A of FIG. 1A at various stages of fabrication, according to some embodiments. Additional fabrication operations can be performed between the various operations of method 200 and can be omitted for simplicity. These additional fabrication operations are within the spirit and the scope of this disclosure. Moreover, not all operations may be required to perform the disclosure provided herein. Additionally, some of the operations can be performed simultaneously or in a different order than the ones shown in FIG. 2. It should be noted that method 200 may not produce a complete FET 100. Accordingly, it is understood that additional processes can be provided before, during, and after method 200, and that some other processes may only be briefly described herein. Elements in FIGS. 3-13 with the same annotations as elements in FIGS. 1A, 1B, 1D, and 1E are described above.

Referring to FIG. 2, in operation 202, a fin structure is formed on a substrate, and the fin structure includes first-type nanostructures and second-type nanostructures. For example, as shown in FIG. 3, fin structure 106 is formed on substrate 104, and fin structure 106 includes first-type nanostructures 302A and 302B and second-type nanostructures 120A and 120B. Fin structure 106 can be patterned by any suitable method. For example, fin structure 106 can be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over substrate 104 and patterned using a photolithography process. Spacers are formed alongside the patterned sacrificial layer using a self-aligned process. The sacrificial layer is then removed, and the remaining spacers may then be used to pattern fin structure 106.

Referring to FIG. 2, in operation 204, a polysilicon structure is formed on the fin structure, and a spacer is formed on the polysilicon structure. For example, as shown in FIG. 4, a polysilicon structure 402 is formed on fin structure 106, and spacer 114 is formed on polysilicon structure 402. The formation of polysilicon structure 402 can include blanket depositing a layer of polysilicon material over fin structure 106 using chemical vapor deposition (CVD), physical vapor deposition (PVD), atomic layer deposition (ALD), or other suitable deposition processes. The blanket deposited polysilicon can then be etched through a patterned hard mask layer (not shown in FIG. 4) formed on the layer of polysilicon material. The etching of the deposited layer of polysilicon material can include a dry etching, a wet etching, or a combination thereof. The formation of spacer 114 can include blanket depositing a layer of an insulating material (e.g., an oxide or a nitride material) over fin structure 106 and polysilicon structure 402 by a CVD, a PVD, or an ALD process followed by an etching process (e.g., reactive ion etching or other dry etching process using a chlorine (Cl) or fluorine (F) based etchant).

Figure 5:
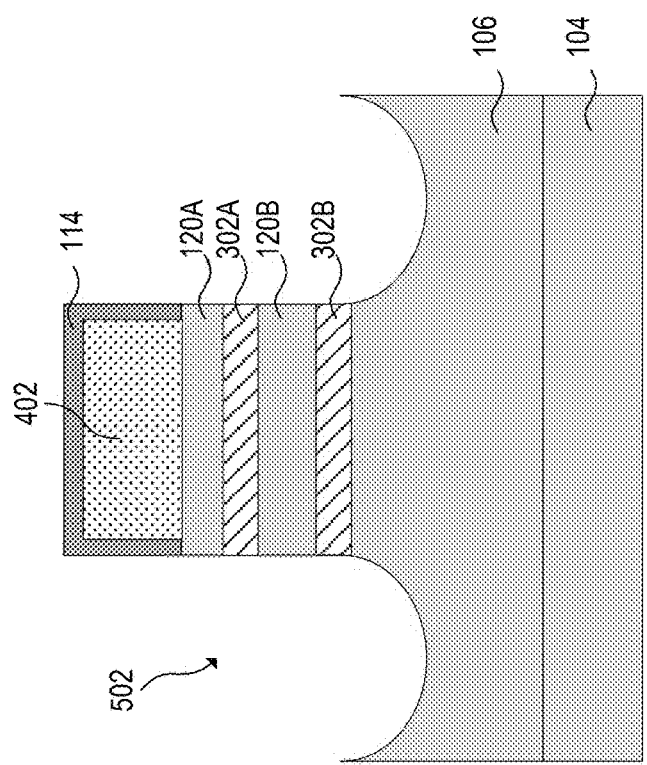

Referring to FIG. 2, in operation 206, portions of the fin structure not covered by the polysilicon structure are removed. For example, as shown in FIG. 5, portions of fin structure 106 not covered by polysilicon structure 402 are removed to form recess openings 502. Recess openings 502 can be formed by a dry etching process (e.g., reactive ion etching process). The dry etching process can use a gas mixture having fluorocarbon ($C_xF_y$), nitrogen ($N_2$), and argon (Ar). Recess openings 502 can be formed by a wet etching process, additionally and/or alternatively. The wet etching process can include a diluted solution of hydrofluoric acid (HF) with a buffer, such as ammonium fluoride ($NH_4F$), diluted HF ($HF/H_2O$), phosphoric acid ($H_3PO_4$), sulfuric acid with deionized water ($H_2SO_4/H_2O$), and any combination thereof. The etching process can be a selective etching or a timed etching.

Figure 6:
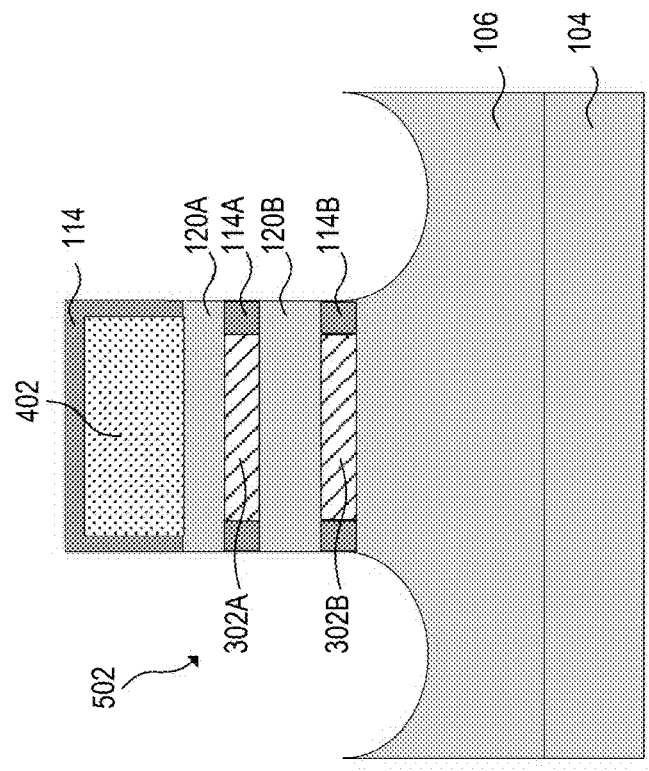

Referring to FIG. 2, in operation 208, an inner spacer is formed at ends of each of the first-type nanostructures. For example, as shown in FIG. 6, inner spacers 114A and 114B are formed at the ends of each of first-type nanostructure 302A and 302B. The formation of inner spacers 114A and 114B can include first laterally recessing the ends of first-type nanostructure 302A and 302B. The lateral recess process can be an etching process using a dry etching process, a wet etching process, or a combination thereof, each having a higher etching selectivity towards first-type nanostructure 302A and 302B than second-type nanostructure 120A and 120B. The laterally recessed ends of first-type nanostructure 302A and 302B can then be filled with a dielectric material using CVD or ALD.

Figure 7:
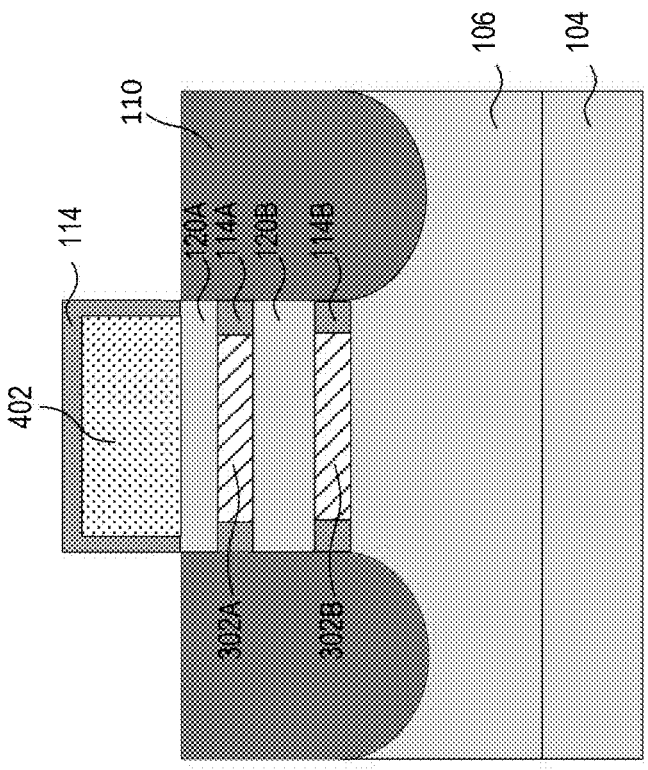

Referring to FIG. 2, in operation 210, an S/D region is formed in the removed portions of the fin structure, and the S/D region can be doped with a dopant. For example, as shown in FIG. 7, S/D regions 110 are formed on opposite ends of a channel region including second-type nanostructures 120A and 120B. By way of example and not limitation, S/D regions 110 can be epitaxially grown using source gases, such as silane ($SiH_4$), silicon tetrachloride ($SiCl_4$), trichlorosilane (TCS), and dichlorosilane ($SiH_2Cl_2$ or DSC). Hydrogen (H2) can be used as a reactant gas to reduce the aforementioned source gases. For example, $H_2$ can combine with Cl to form hydrogen chloride (HCl), leaving Si to epitaxially grow in S/D regions 110. The growth temperature during the epitaxial growth can range from about 700° C. to about 1250° C. depending on the gases used. According to some embodiments, S/D regions 110 can have the same crystallographic orientation as substrate 104 or fin structures 106 since substrate 104 or fin structures 106 can act as a seed layer for S/D regions 110. In some embodiments, a top surface of S/D regions 110 can be parallel to the (100) crystal plane. S/D regions 110 can be in-situ doped during their epitaxial growth process using p-type dopants, such as B, In, and Ga, or n-type dopants, such as P and As. For p-type in-situ doping, p-type doping precursors, such as diborane ($B_2H_6$), boron trifluoride ($BF_3$), and other p-type doping precursors can be used. For n-type in-situ doping, n-type doping precursors, such as phosphine ($PH_3$), arsine ($AsH_3$), and other n-type doping precursor can be used.

Figure 8:
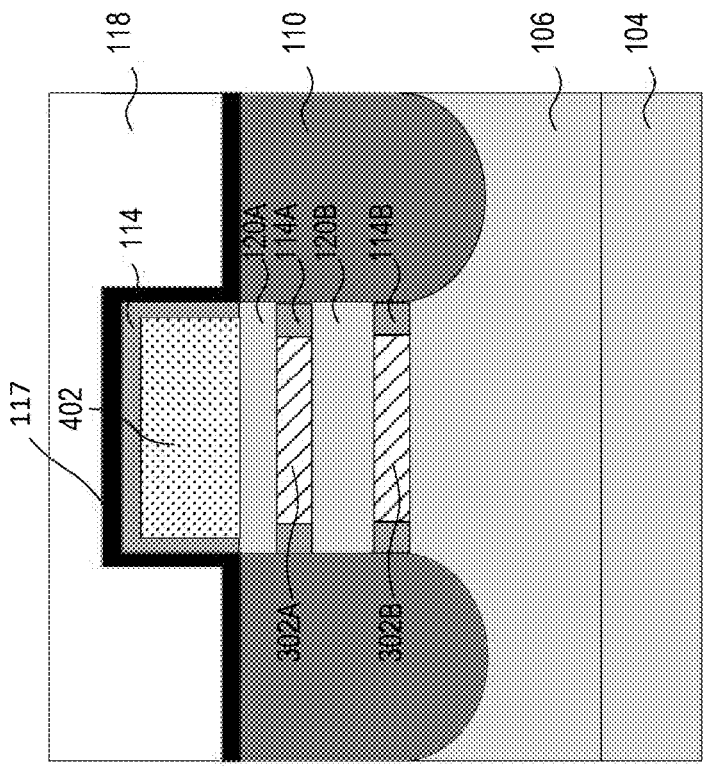

Referring to FIG. 2, in operation 212, an ESL and an ILD layer can be deposited on the spacer and on the S/D regions. For example, as shown in FIG. 8, ESL 117 and ILD layer 118 are deposited on spacer 114 and S/D regions 110. ESL 117 and ILD layer 118 can be insulating materials deposited using PVD, CVD, or plasma-enhanced chemical vapor deposition (PECVD). In some embodiments, a chemical mechanical polishing/planarization (CMP) process can follow the deposition of ESL 117 and ILD layer 118, such that polysilicon structure 402 can be exposed for removal in the following operation.

Referring to FIG. 2, in operation 214, the polysilicon structure and the first-type nanostructures of the fin structure are released. For example, as shown in FIG. 9, polysilicon structure 402 is released to form polysilicon opening 902. First-type nanostructures 302A and 302B of fin structure 106 are released to form first-type nanostructure openings 904A and 904B. Release of polysilicon structure 402 and first-type nanostructures 302A and 302B can be achieved using a dry etching process (e.g., reactive ion etching) or a wet etching process, each having a higher etching rate towards polysilicon structure 402 and first-type nanostructures 302A and 302B and a lower etching rate towards fin structure 106, spacer 114, and inner spacers 114A and 114B. In some embodiments, the gas etchants used in the dry etching process can include Cl, F, bromine (Br), or a combination thereof. In some embodiments, an ammonium hydroxide ($NH_4OH$), sodium hydroxide (NaOH), or potassium hydroxide (KOH) wet etching can be used to remove polysilicon structure 402 and first-type nanostructures 302A and 302B.

Referring to FIG. 2, in operation 216, the second-type nanostructures are doped with a dopant via a space released by the polysilicon structure and the first-type nanostructures of the fin structure. For example, as shown in FIG. 9, a plasma doping process can be used to dope second-type nanostructures 120A and 120B via polysilicon opening 902 and first-type nanostructure openings 904A and 904B. For p-type plasma doping, p-type doping precursors, such as $B_2H_6$, $BF_3$, and other p-type doping precursors, can be used. For n-type plasma doping, n-type doping precursors, such as $PH_3$, $AsH_3$, and other n-type doping precursors can be used. For counter-doping, the dopant type selected for second-type nanostructures 120A and 120B is opposite to the dopant type selected for S/D regions 110. Xenon (Xe), helium (He), or Ar can be used as a carrier gas for the doping precursors. Temperature of the plasma doping process can be between about 5° C. and about 120° C., between about 8° C. and about 110° C., and between about 10° C. and about 100° C. A bias voltage of the plasma doping process can be between about 0.3 kV and about 6 kV, between about 0.4 kV and about 5.5 kV, and between about 0.5 kV and about 5 kV. Pressure in the plasma doping chamber can be between about 5 Torr and about 120 Torr, between about 8 Torr and about 110 Torr, and between about 10 Torr and about 100 Torr. These plasma doping process parameters for temperature, bias voltage, and pressure can result in optimal doping concentration and uniformity in second-type nanostructures 120A and 120B. For example, if the temperature is less than about 5° C., the bias voltage is less than about 0.3 kV, or the pressure is less than about 5 Torr, the doping concentration may be too low to achieve counter-doping, resulting in insufficient leakage current reduction. If the temperature is greater than about 120° C., the bias voltage is greater than about 6 kV, or the pressure is greater than about 120 Torr, the doping concentration may be too high, resulting in degraded on current. As shown in FIG. 10, counter-doped portions 122A, 122B, and 122C are formed within second-type nanostructures 120A and 120B and fin structure 106. The plasma doping can be limited by polysilicon opening 902 and first-type nanostructure openings 904A and 904B. Because spacer 114 and inner spacers 114A and 114B prevent doping precursors from reaching the ends of second-type nanostructures 120A and 120B and fin structure 106, counter-doped portions 122A, 122B, and 122C may not be able to reach the entirety of second-type nanostructures 120A and 120B and fin structure 106.

Figure 11:
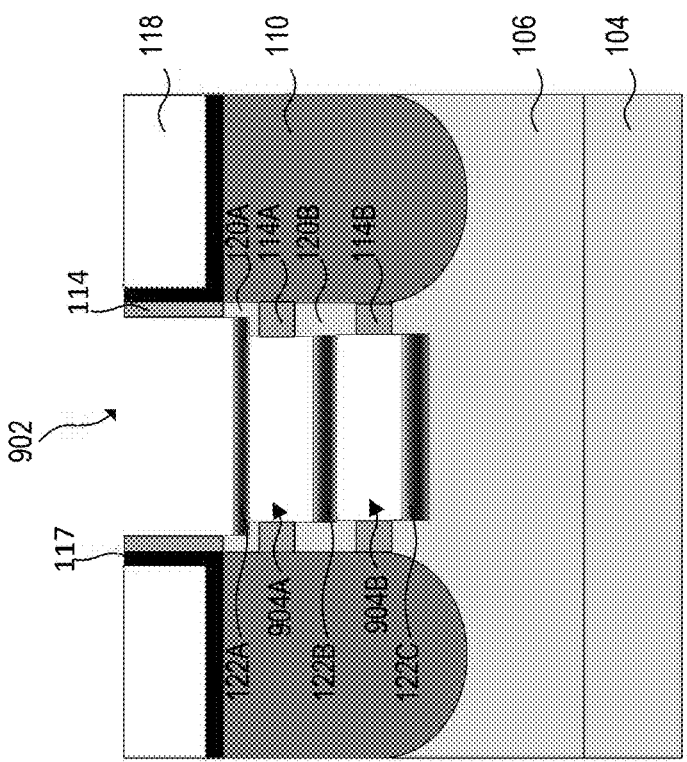

Referring to FIG. 2, in operation 218, portions of the doped second-type nanostructures are removed. For example, as shown in FIG. 11, portions of counter-doped portions 122A, 122B, and 122C are removed. Portions of counter-doped portions 122A, 122B, and 122C can be removed by wet etching. In some embodiments, the wet etchants can include HF, ozonated deionized water ($DIO_3$), ammonium hydroxide ($NH_4OH$), KOH, tetramethylammonium hydroxide (TMAH), or a combination thereof. Temperature of the wet etching process can be between about 5° C. and about 90° C., between about 8° C. and about 80° C., and between about 10° C. and about 70° C. Duration of the wet etching process can be between about 5 s and about 700 s, between about 8 s and about 650 s, and between about 10 s and about 600 s. These wet etching process parameters of temperature and duration can result in optimal height of counter-doped portions 122A, 122B, and 122C. For example, if the temperature is less than about 5° C., or the duration is less than about 5 s, the height of counter-doped portions 122A, 122B, and 122C may be too great, resulting in degraded on current. If the temperature is greater than about 90° C. or the duration is greater than about 700 s, the height of counter-doped portions 122A, 122B, and 122C may be too small, resulting in insufficient leakage current reduction.

Figure 12:
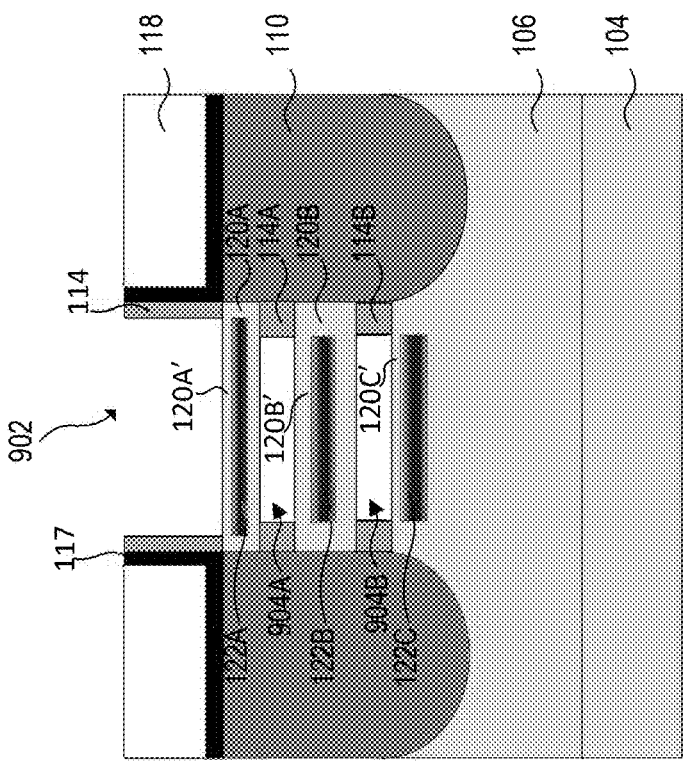

Referring to FIG. 2, in operation 220, additional second-type nanostructures are formed where the portions of the doped second-type nanostructures are removed. For example, as shown in FIG. 12, additional second-type nanostructures 120A' and 120B' and additional fin structure 120C' are formed where the portions of counter-doped portions 122A, 122B, and 122C are removed. Additional second-type nanostructures 120A' and 120B' and additional fin structure 120C' can be epitaxially grown. By way of example and not limitation, additional second-type nanostructures 120A' and 120B' and additional fin structure 120C' can be epitaxially grown using source gases, such as $SiH_4$ and DSC. The growth temperature during the epitaxial growth can range from about 500° C. to about 700° C. depending on the gases used. The flow rate during the epitaxial growth can range from about 10 sccm to about 100 sccm. The pressure in the epitaxial growth chamber can range from about 10 Torr to about 100 Torr. According to some embodiments, additional second-type nanostructures 120A' and 120B' and additional fin structure 120C' can inherit the same crystallographic orientation as second-type nanostructures 120A and 120B and fin structure 106 since second-type nanostructures 120A and 120B and fin structure 106 effectively function as a seed layer for additional second-type nanostructures 120A' and 120B' and additional fin structure 120C'. Additional second-type nanostructures 120A' and 120B' and additional fin structure 120C' can be intrinsic or undoped. Therefore, counter-doped portions 122A, 122B, and 122C can be surrounded by second-type nanostructures 120A and 120B and fin structure 106. Since leakage current is higher at or near the center of second-type nanostructures 120A and 120B, counter-doped portions 122A, 122B, and 122C can reduce leakage current. In some embodiments, not all portions of second-type nanostructures 120A and 120B are counter-doped to prevent on current degradation.

Figure 13:
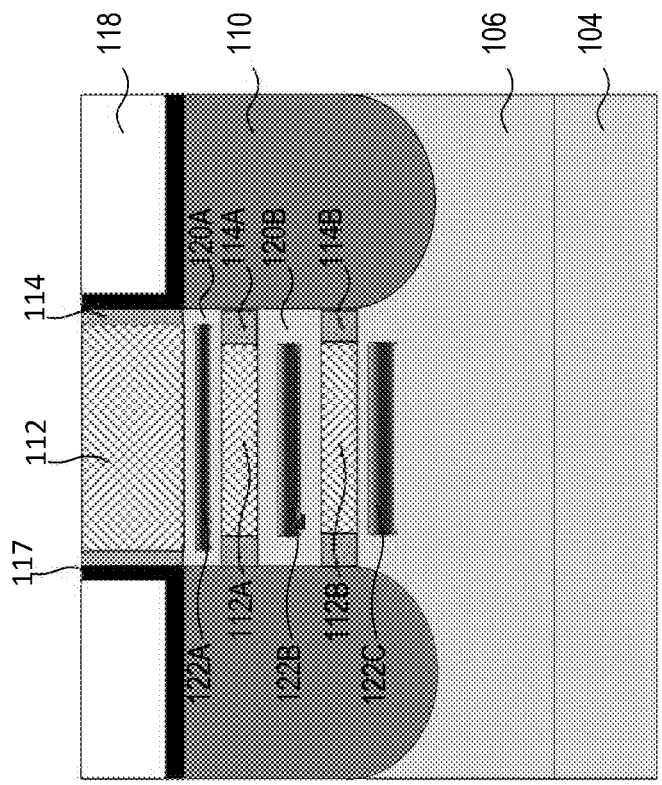

Referring to FIG. 2, in operation 222, a gate structure is formed in the space released by the polysilicon structure and the first-type nanostructures. For example, as shown in FIG. 13, gate structures 112, 112A, and 112B are formed in polysilicon opening 902 and first-type nanostructure openings 904A and 904B. Gate structures 112, 112A, and 112B can include a multi-layered structure with IO layer, HK gate dielectric layer, WFM layer, and gate metal fill layer. These layers are not shown in FIG. 13 for simplicity. IO layer can be deposited using PECVD, CVD, or ALD. HK gate dielectric layer can be deposited using PECVD, CVD, PVD, or ALD. WFM layer can be deposited by PECVD, CVD, PVD, ALD, metal organic chemical vapor deposition (MOCVD), sputtering, other suitable deposition methods, or any combination thereof. Gate metal fill layer can be formed by PECVD, CVD, PVD, ALD, MOCVD, sputtering, other suitable deposition methods, or any combination thereof. When gate structures 112, 112A, and 112B are biased at an off state, S/D tunneling can cause leakage current to flow between S/D regions 110. The leakage current can lead to unreliable devices and device failure. Counter-doped portions 122A, 122B, and 122C can reduce leakage current because counter-doped portions 122A, 122B, and 122C have the opposite dopant to that of S/D regions 110. Counter-doped portions 122A, 122B, and 122C can improve device reliability and reduce device failure.

Figure 14A:
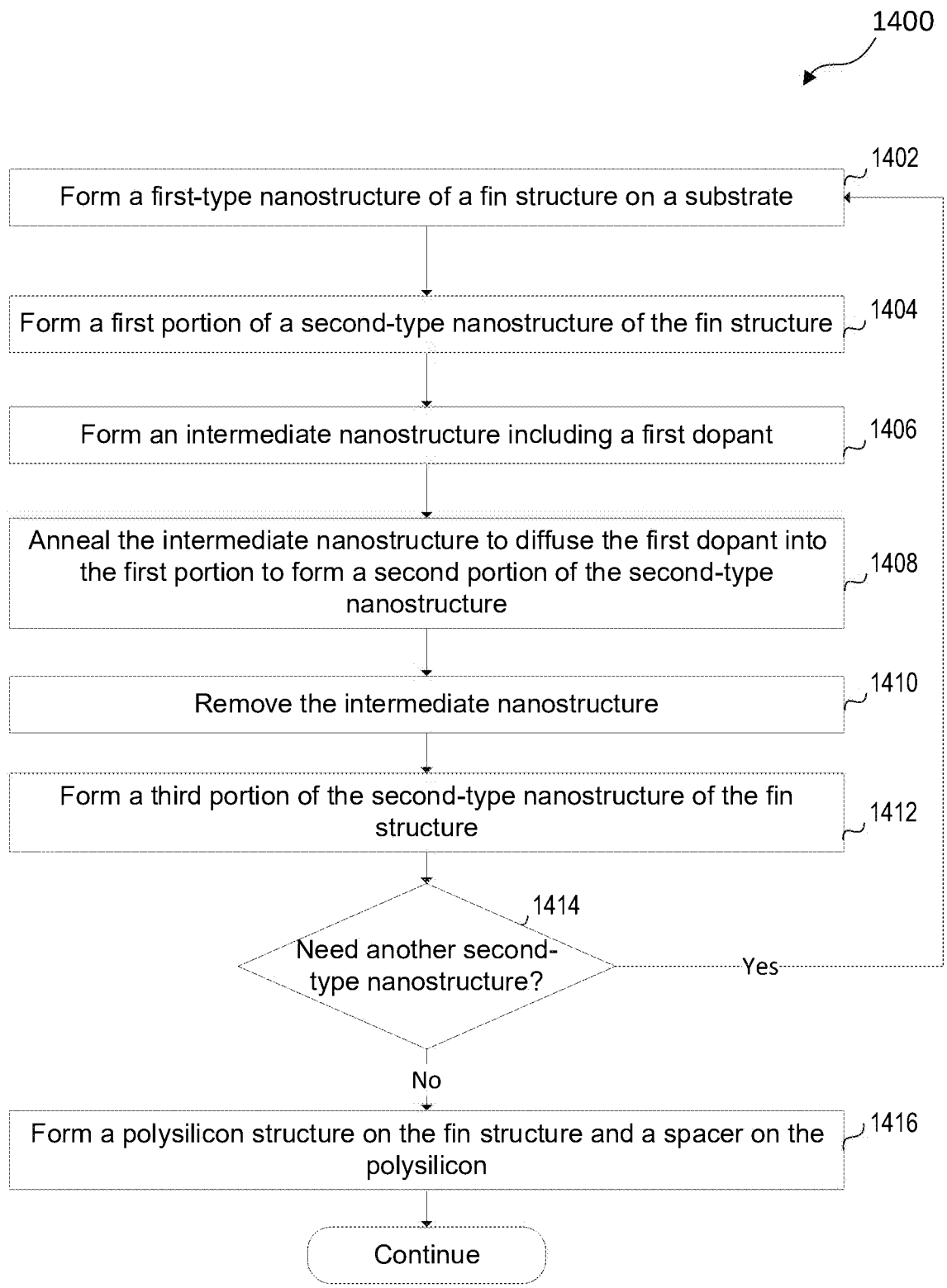
FIGS. 14A and 14B are a flow diagram of another method for fabricating a semiconductor device with counter-doped nanostructures, in accordance with some embodiments.
Figure 14B:
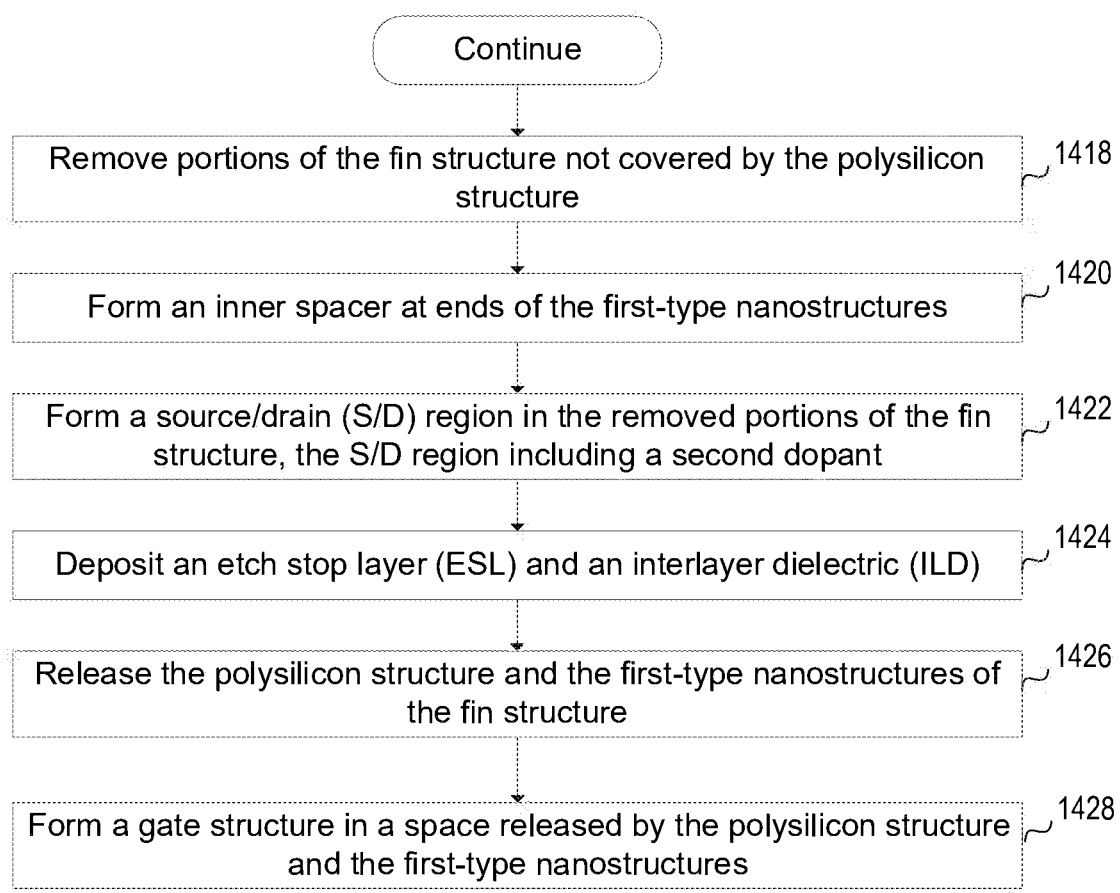

According to some embodiments, FIGS. 14A and 14B are flow diagrams describing another method 1400 for fabricating FET 100, as shown in FIGS. 1A and 1C. For illustrative purposes, the operations illustrated in FIGS. 14A and 14B will be described with reference to the example fabrication process for fabricating FET 100 as illustrated in FIGS. 15-27. FIGS. 15-27 are cross-sectional views of FET 100 along line A-A of FIG. 1A at various stages of fabrication, according to some embodiments. Additional fabrication operations can be performed between the various operations of method 1400 and can be omitted for simplicity. These additional fabrication operations are within the spirit and the scope of this disclosure. Moreover, not all operations may be required to perform the disclosure provided herein. Additionally, some of the operations can be performed simultaneously or in a different order than the ones shown in FIGS. 14A and 14B. It should be noted that method 1400 may not produce a complete FET 100. Accordingly, it is understood that additional processes can be provided before, during, and after method 1400, and that some other processes may only be briefly described herein. Elements in FIGS. 15-27 with the same annotations as elements in FIGS. 1A and 1C are described above.

Figures 15, 16:
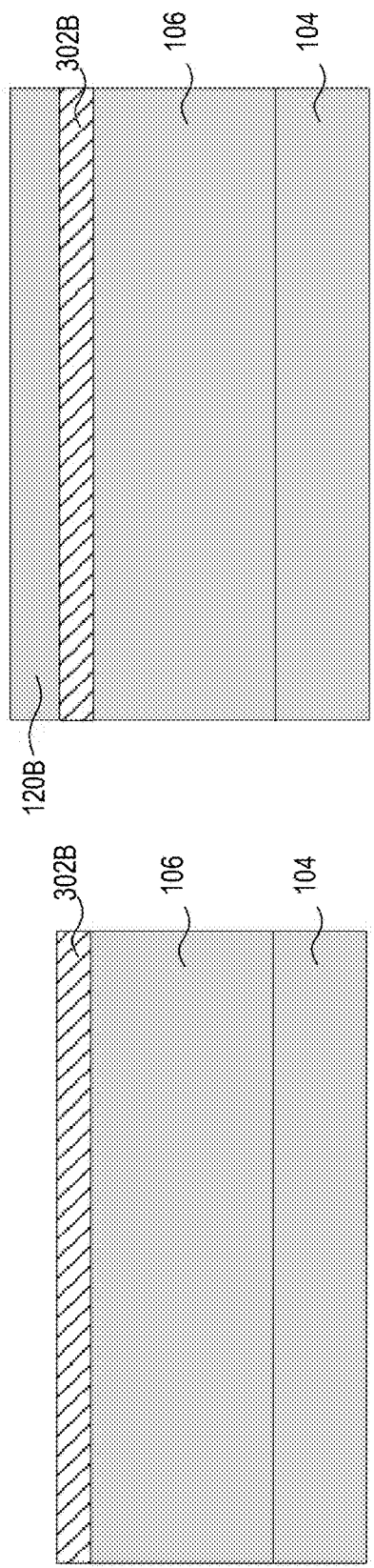

Referring to FIGS. 14A and 14B, in operation 1402, a first-type nanostructure of a fin structure is formed on a substrate. For example, as shown in FIG. 15, first-type nanostructure 302B of fin structure 106 is formed on substrate 104. By way of example and not limitation, first-type nanostructure 302B can be epitaxially grown using source gases, such as disilane ($Si_2H_6$) and germane ($GeH_4$). The growth temperature during the epitaxial growth can range from about 500° C. to about 700° C. The flow rate during the epitaxial growth can range from about 10 sccm to about 100 sccm. The pressure in the epitaxial growth chamber can range from about 10 Torr to about 100 Torr.

Referring to FIGS. 14A and 14B, in operation 1404, a first portion of a second-type nanostructure of the fin structure is formed on the first-type nanostructure. For example, as shown in FIG. 16, a first portion of second-type nanostructure 120B of fin structure 106 is formed on first-type nanostructure 302B. The first portion of second-type nanostructure 120B can be epitaxially grown using source gases, such as $SiH_4$ and DSC. The growth temperature during the epitaxial growth can range from about 500° C. to about 700° C. depending on the gases used. The flow rate during the epitaxial growth can range from about 10 sccm to about 100 sccm. The pressure in the epitaxial growth chamber can range from about 10 Torr to about 100 Torr.

Figures 17, 18:
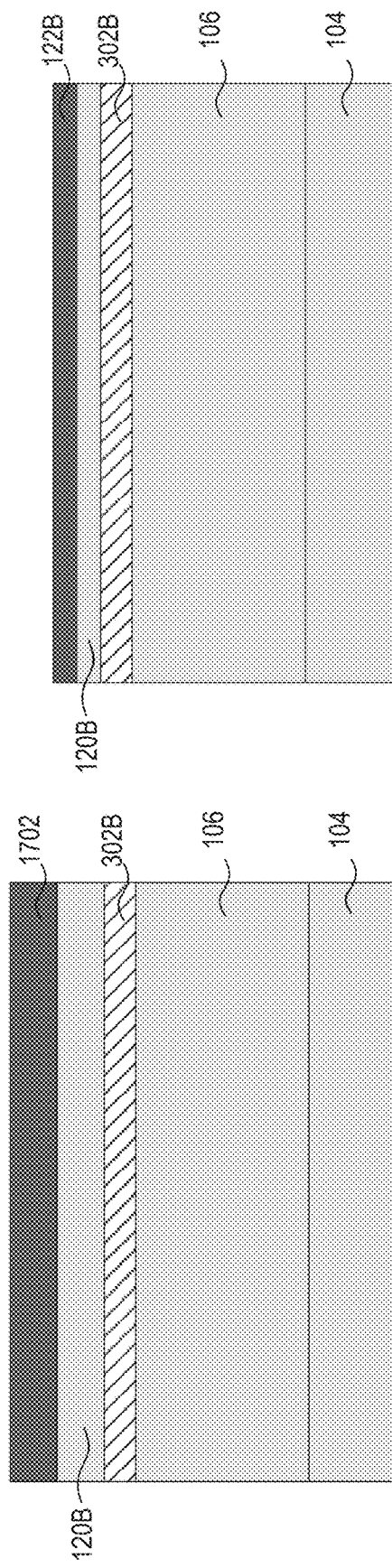

Referring to FIGS. 14A and 14B, in operation 1406, an intermediate nanostructure including a dopant is formed on the first portion of the second-type nanostructure. For example, as shown in FIG. 17, intermediate nanostructure 1702 is formed on the first portion of second-type nanostructure 120B. Intermediate nanostructure 1702 can be epitaxially grown using source gases, such as $SiH_4$ and DSC. Intermediate nanostructure 1702 can be doped during epitaxial growth. For p-type doping, p-type doping precursors, such as $B_2H6$, $BF_3$, and other p-type doping precursors, can be used. For n-type doping, n-type doping precursors, such as $PH_3$, $AsH_3$, and other n-type doping precursors, can be used. The growth temperature during the epitaxial growth can range from about 500° C. to about 700° C. depending on the gases used. The flow rate during the epitaxial growth can range from about 10 sccm to about 100 sccm. The pressure in the epitaxial growth chamber can range from about 10 Torr to about 100 Torr.

Referring to FIGS. 14A and 14B, in operation 1408, an anneal is performed such that the dopant in the intermediate nanostructure diffuses into the first portion of the second-type nanostructure. For example, as shown in FIG. 17, an anneal is performed such that the dopant in intermediate nanostructure 1702 can diffuse into the first portion of second-type nanostructure 120B. The temperature of the anneal can be between about 350° C. and about 1300° C., between about 380° C. and about 1250° C., and between about 400° C. and about 1200° C. The duration of the anneal can be between about 0.5 ns and about 60 s, between about 0.8 ns and about 55 s, and between about 1 ns and about 50 s. $N_2$ can be used as a protective gas against oxidation of intermediate nanostructure 1702. Pressure in the annealing chamber can range from about 10 Torr to about 50 Torr. These annealing process parameters of temperature and duration can result in optimal height and diffused dopant concentration of counter-doped portion 122B, as shown in FIG. 18. For example, if the temperature is less than about 350° C. or the duration is less than about 0.5 ns, the height of counter-doped portion 122B may be too small, or the dopant concentration diffused in counter-doped portion 122B may be too low to achieve counter-doping, both resulting in insufficient leakage current reduction. If the temperature is greater than about 1300° C. or the duration is greater than about 60 s, the height of counter-doped portion 122B may be too great, or the dopant concentration diffused in counter-doped portion 122B may be too high, both resulting in degraded on current.

Referring to FIGS. 14A and 14B, in operation 1410, the intermediate nanostructure is removed. For example, as shown in FIG. 18, intermediate nanostructure 1702 is removed. Dopants in intermediate nanostructure 1702 diffuse into a top part of the first portion of second-type nanostructure 120B, the top part forming a second portion, or counter-doped portion 122B, of second-type nanostructure 120B. Intermediate nanostructure 1702 can be removed by dry etching or wet etching. The dry etching process can use a gas mixture having $C_xF_y$, $N_2$, and Ar. The wet etching process can include HF with $NH_4F$ or $H_2O$, $H_3PO_4$, or $H_2SO_4/H_2O$. The etching process can be a selective etching or a timed etching. In some embodiments, portions of second-type nanostructure 120B can also be removed.

Figure 19:
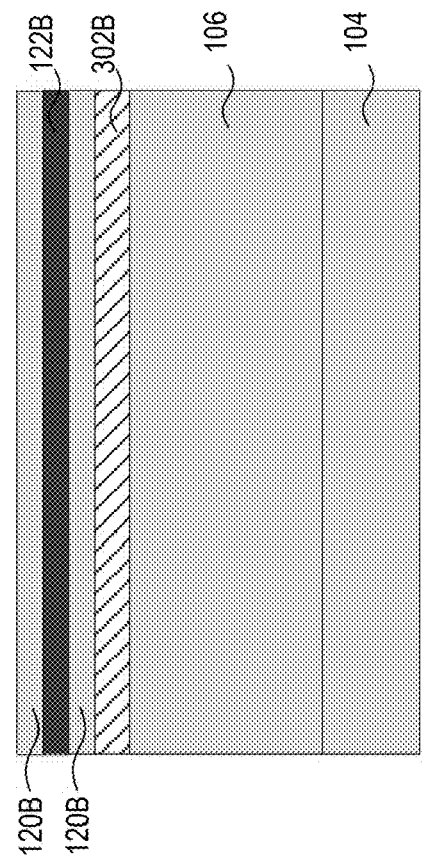

Referring to FIGS. 14A and 14B, in operation 1412, a third portion of the second-type nanostructure of the fin structure is formed on the second portion. For example, as shown in FIG. 19, a third portion of second-type nanostructure 120B of fin structure 106 is formed on second portion (counter-doped portion) 122B of second-type nanostructure 120B. The third portion can be formed in a manner similar to that described with reference to FIG. 16 and operation 1404 of FIGS. 14A and 14B. After the third portion is formed, counter-doped portion 122B is sandwiched between the first portion and the third portion of second-type nanostructure 120B. Since the center of second-type nanostructure 120B has the highest leakage current, counter-doped portion 122B can reduce leakage current and improve device reliability and reduce device failure.

Figure 20:
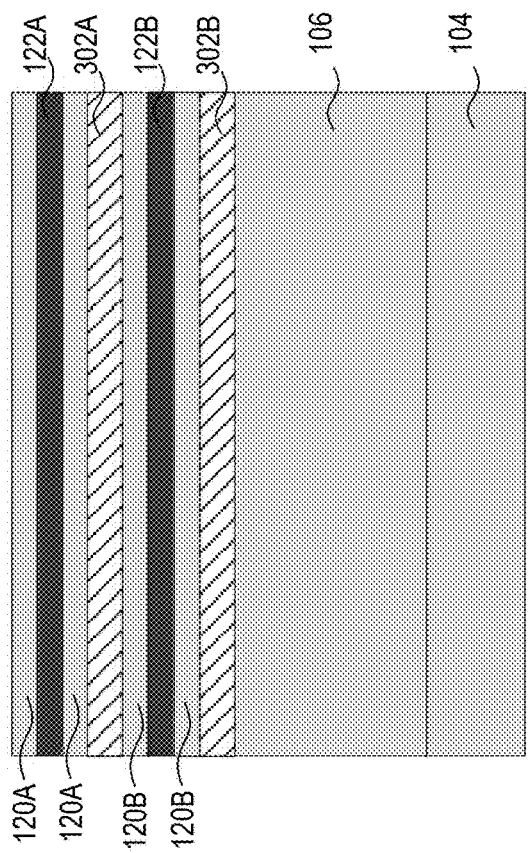

Referring to FIGS. 14A and 14B, in operation 1414, a decision can be made whether another second-type nanostructure is needed. If yes, operations 1402-1412 can be repeated to form another counter-doped portion within another second-type nanostructure. For example, as shown in FIG. 20, counter-doped portion 122A and second-type nanostructure 120A can be formed in a manner similar to that described with reference to FIGS. 15-19 and operations 1402-1412 of FIGS. 14A and 14B. While the intermediate nanostructure is annealed in the formation of counter-doped portion 122A and second-type nanostructure 120A, counter-doped portion 122B can continue to diffuse into second-type nanostructure 120B, resulting in a thicker or less concentrated counter-doped portion 122B. If no additional second-type nanostructures are needed, fin structure 106 can be patterned in a manner similar to that described with reference to FIG. 3 and operation 202 of FIG. 2.

Figure 21:
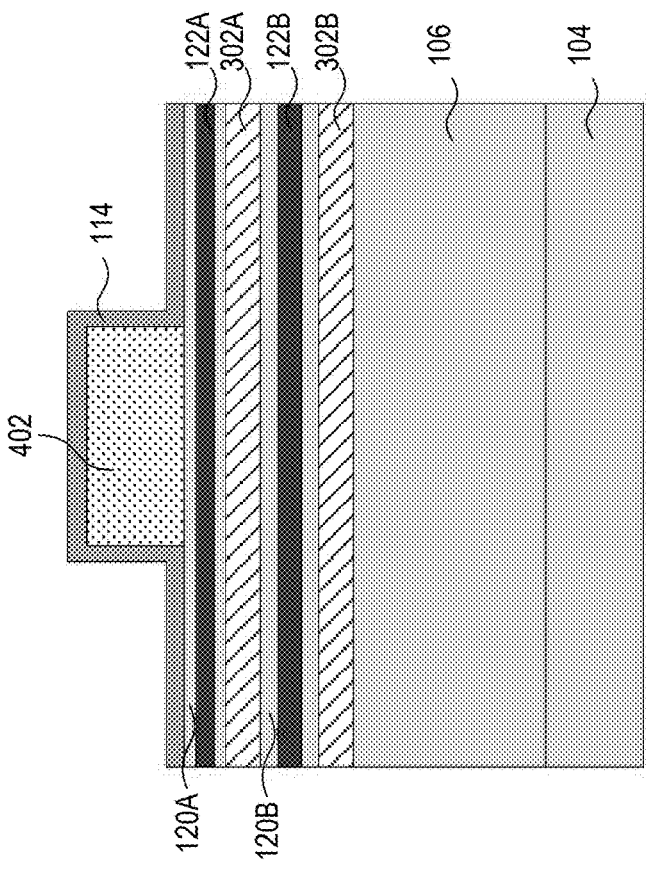

Referring to FIGS. 14A and 14B, in operation 1416, a polysilicon structure is formed on the fin structure and a spacer is formed on the polysilicon structure. For example, as shown in FIG. 21, polysilicon structure 402 is formed on fin structure 106 and spacer 114 is formed on polysilicon structure 402. Polysilicon structure 402 and spacer 114 can be formed in a manner similar to that described with reference to FIG. 4 and operation 204 of FIG. 2.

Figure 22:
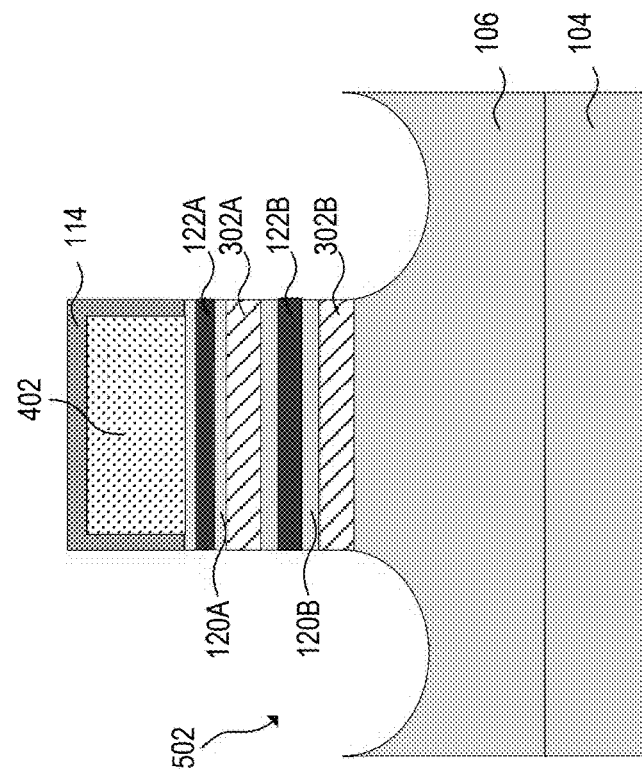

Referring to FIGS. 14A and 14B, in operation 1418, portions of the fin structure not covered by the polysilicon structure are removed. For example, as shown in FIG. 22, portions of fin structure 106 not covered by polysilicon structure 402 are removed and recess openings 502 are formed. Recess openings 502 can be formed in a manner similar to that described with reference to FIG. 5 and operation 206 of FIG. 2.

Figure 23:
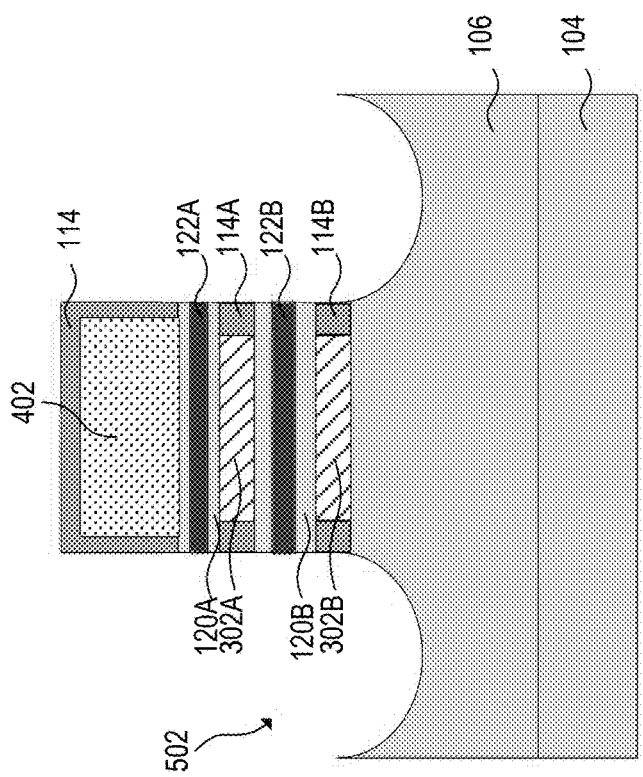

Referring to FIGS. 14A and 14B, in operation 1420, an inner spacer is formed at ends of each of the first-type nanostructure. For example, as shown in FIG. 23, inner spacers 114A and 114B are formed at ends of each of first-type nanostructures 302A and 302B. Inner spacers 114A and 114B can be formed in a manner similar to that described with reference to FIG. 6 and operation 208 of FIG. 2.

Figure 24:
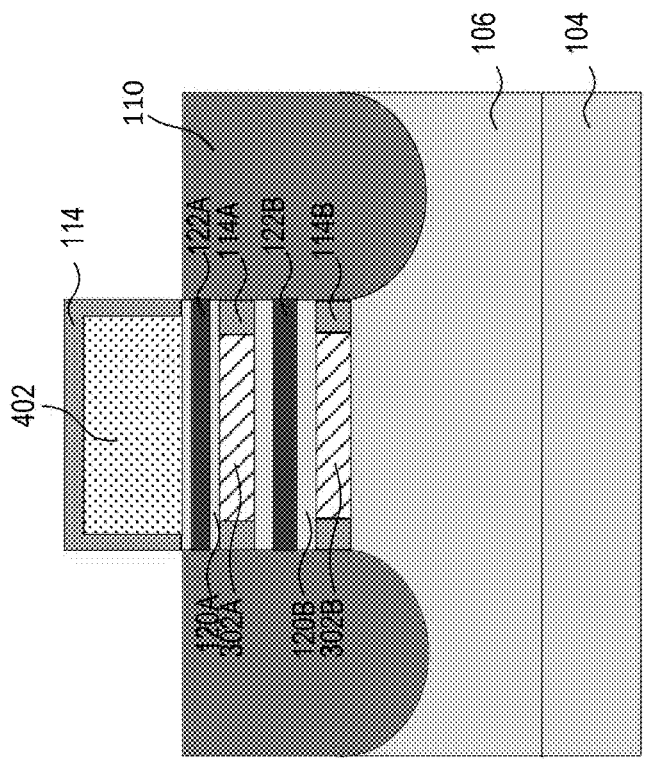

Referring to FIGS. 14A and 14B, in operation 1422, an S/D region is formed on the removed portions of the fin structure. For example, as shown in FIG. 24, S/D regions 110 are formed in the recess openings 502. S/D regions 110 can be formed in a manner similar to that described with reference to FIG. 7 and operation 210 of FIG. 2. S/D regions 110 can have a dopant that is different from that of counter-doped portions 122A and 122B.

Figure 25:
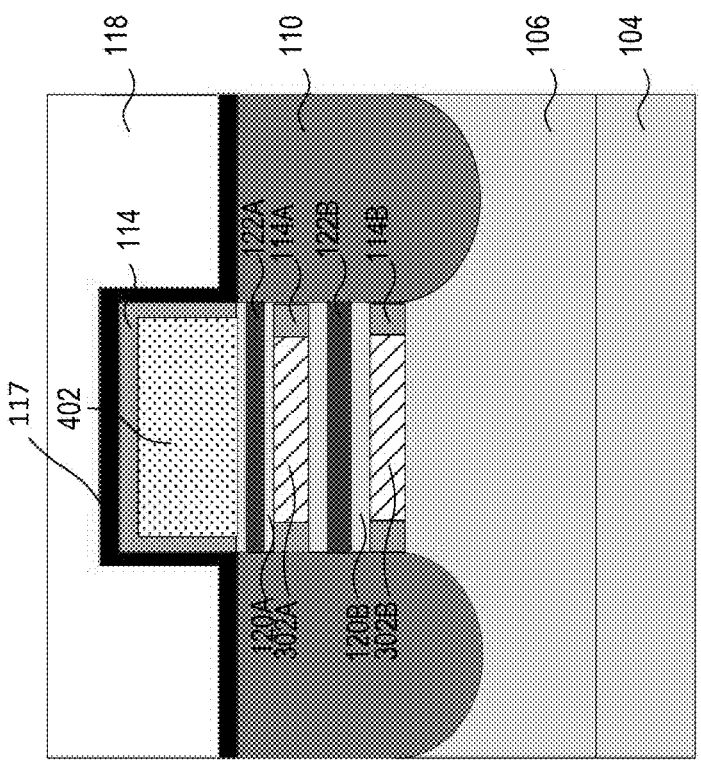

Referring to FIGS. 14A and 14B, in operation 1424, an ESL and an ILD layer can be deposited on the spacer and the S/D regions. For example, as shown in FIG. 25, ESL 117 and ILD layer 118 are deposited on spacer 114 and S/D regions 110. ESL 117 and ILD layer 118 can be deposited in a manner similar to that described with reference to FIG. 8 and operation 212 of FIG. 2.

Figure 26:
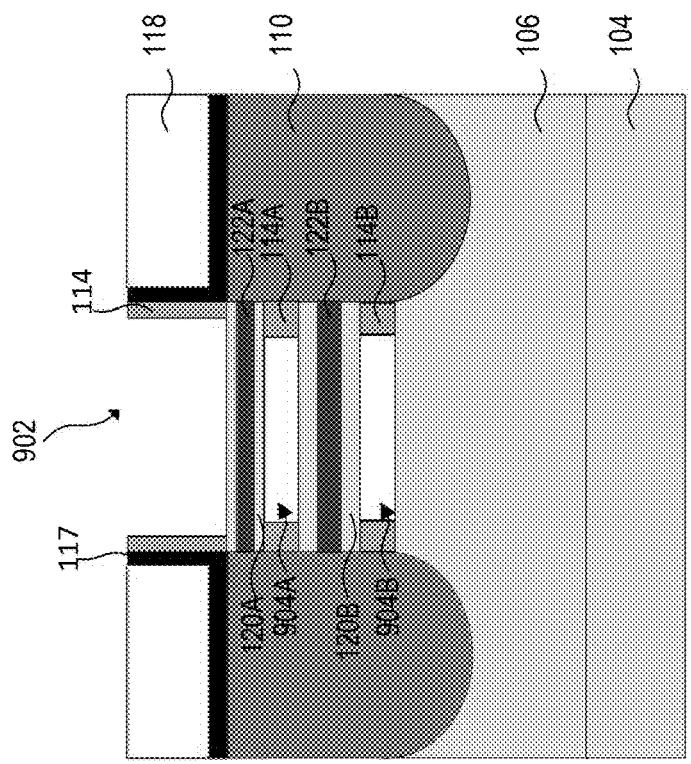

Referring to FIGS. 14A and 14B, in operation 1426, the polysilicon structure and the first-type nanostructures of the fin structure are released. For example, as shown in FIG. 26, polysilicon structure 402 and first-type nanostructures 302A and 302B of fin structure 106 are released. Polysilicon opening 902 and first-type nanostructure openings 904A and 904B are formed. Polysilicon opening 902 and first-type nanostructure openings 904A and 904B can be formed in a manner similar to that described with reference to FIG. 9 and operation 214 of FIG. 2.

Referring to FIGS. 14A and 14B, in operation 1428, a gate structure is formed in the space released by the polysilicon structure and the first-type nanostructures. For example, as shown in FIG. 27, gate structures 112, 112A, and 112B are formed in polysilicon opening 902 and first-type nanostructure openings 904A and 904B. Gate structures 112, 112A, and 112B can be formed in a manner similar to that described with reference to FIG. 13 and operation 222 of FIG. 2. When gate structures 112, 112A, and 112B are biased at an off state, S/D tunneling can cause leakage current to flow between S/D regions 110. The leakage current can lead to unreliable devices and device failure. Counter-doped portions 122A and 122B can reduce leakage current because counter-doped portions 122A and 122B have the opposite dopant to that of S/D regions 110. Counter-doped portions 122A and 122B can improve device reliability and reduce device failure. The sandwich structure of counter-doped portions 122A and 122B and second-type nanostructures 120A and 120B is such that not all portions of second-type nanostructures 120A and 120B are counter-doped because such counter-doping would degrade on current, according to some embodiments.

Figure 28:
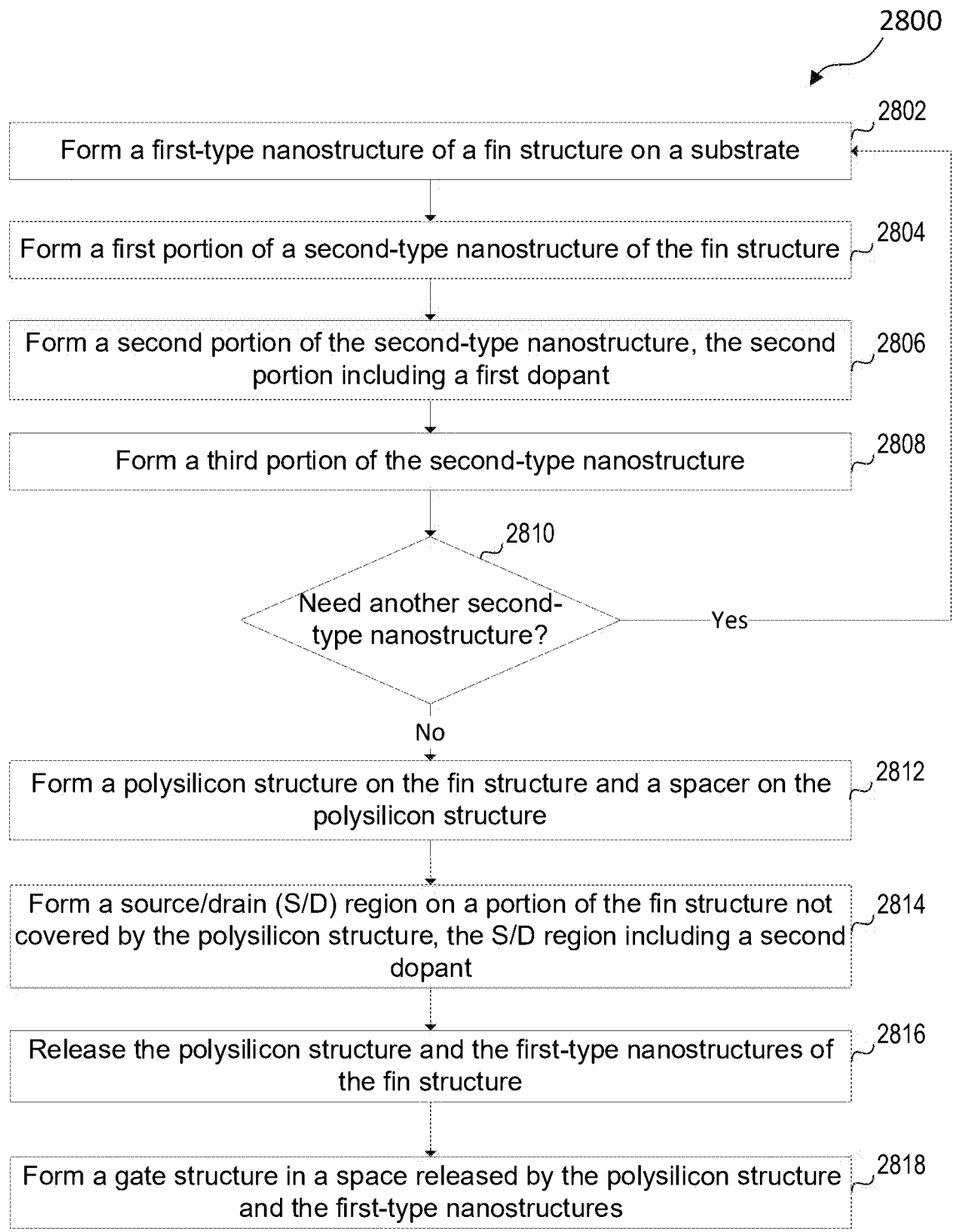
FIG. 28 is a flow diagram of yet another method for fabricating a semiconductor device with counter-doped nanostructures, in accordance with some embodiments.

According to some embodiments, FIG. 28 is a flow diagram describing yet another method 2800 for fabricating FET 100, as shown in FIGS. 1A and 1C. For illustrative purposes, the operations illustrated in FIG. 28 will be described with reference to the example fabrication process for fabricating FET 100 as illustrated in FIGS. 29-34. FIGS. 29-34 are cross-sectional views of FET 100 along line A-A of FIG. 1A at various stages of fabrication, according to some embodiments. Additional fabrication operations can be performed between the various operations of method 2800 and can be omitted for simplicity. These additional fabrication operations are within the spirit and the scope of this disclosure. Moreover, not all operations may be required to perform the disclosure provided herein. Additionally, some of the operations can be performed simultaneously or in a different order than the ones shown in FIG. 28. It should be noted that method 2800 may not produce a complete FET 100. Accordingly, it is understood that additional processes can be provided before, during, and after method 2800, and that some other processes may only be briefly described herein. Elements in FIGS. 29-34 with the same annotations as elements in FIGS. 1A or 1C are described above.

Figure 29:
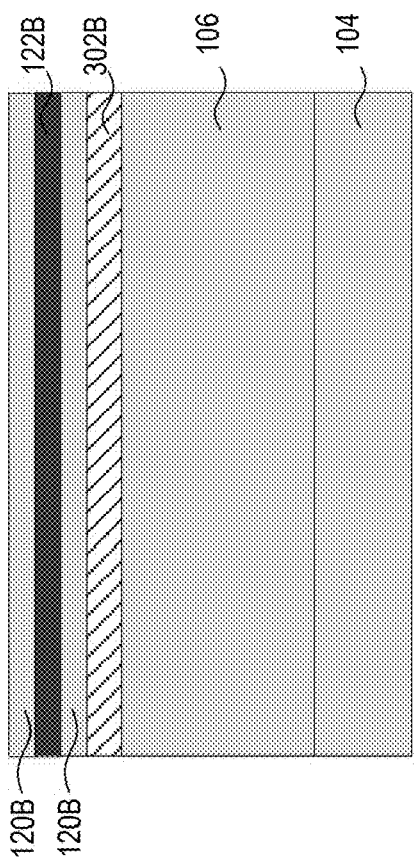

Referring to FIG. 28, in operations 2802-2808, different layers of nanostructures are epitaxially grown in a sequence. No thermal anneal or layer removal is required. A first-type nanostructure of a fin structure is formed on a substrate, a first portion of a second-type nanostructure of the fin structure is formed on the first-type nanostructure, a second portion of the second-type nanostructure is formed on the first portion, and a third portion of the second-type nanostructure is formed on the second portion. For example, as shown in FIG. 29, first-type nanostructure 302B of fin structure 106 is formed on substrate 104. First-type nanostructure 302B can be formed in a manner similar to that described with reference to FIG. 15 and operation 1402 of FIGS. 14A and 14B. A first portion of second-type nanostructure 120B of fin structure 106 is formed on first-type nanostructure 302B. The first portion of second-type nanostructure 120B can be formed in a manner similar to that described with reference to FIG. 16 and operation 1404 of FIGS. 14A and 14B. A second portion 122B of second-type nanostructure 120B is formed on the first portion. The second portion 122B of second-type nanostructure 120B can be formed in a manner similar to that described with reference to FIG. 17 and operation 1406 of FIGS. 14A and 14B. Dopants can be added during epitaxial growth of the second portion (counter-doped portion) 122B. A third portion of second-type nanostructure 120B is formed on the second portion. The third portion of second-type nanostructure 120B can be formed in a manner similar to that described with reference to FIG. 16 and operation 1412 of FIGS. 14A and 14B. After the third portion is formed, counter-doped portion 122B is sandwiched between the first portion and the third portion of second-type nanostructure 120B. Since the center of second-type nanostructure 120B has the highest leakage current, counter-doped portion 122B can reduce leakage current and improve device reliability and reduce device failure.

Figure 30:
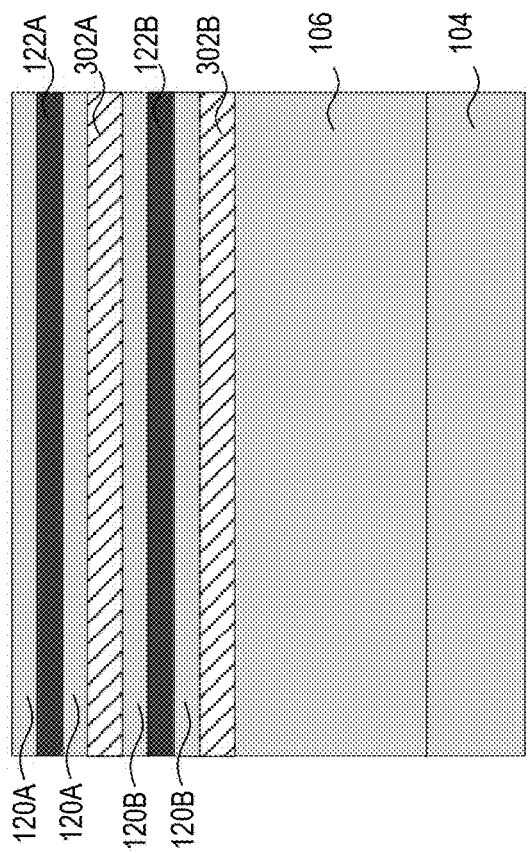
FIGS. 29-34 illustrate cross-sectional views of a semiconductor device with counter-doped nanostructures at various stages of its fabrication process, in accordance with some embodiments.

Referring to FIG. 28, in operation 2810, a decision can be made whether another second-type nanostructure is needed. If yes, operations 2802-2808 can be repeated to form another counter-doped portion within another second-type nanostructure. For example, as shown in FIG. 30, counter-doped portion 122A and second-type nanostructure 120A can be formed in a manner similar to that described with reference to FIGS. 15-17 and operations 1402-1406 and 1412 of FIGS. 14A and 14B. If no additional second-type nanostructures are needed, fin structure 106 can be patterned in a manner similar to that described with reference to FIG. 3 and operation 202 of FIG. 2. The sandwich structure of counter-doped portions 122A and 122B and second-type nanostructures 120A and 120B is such that not all portions of second-type nanostructures 120A and 120B are counter-doped because such counter-doping would degrade on current, according to some embodiments. Because there is no thermal anneal, counter-doped portions 122A and 122B can have a similar thickness or a similar dopant concentration.

Figure 31:
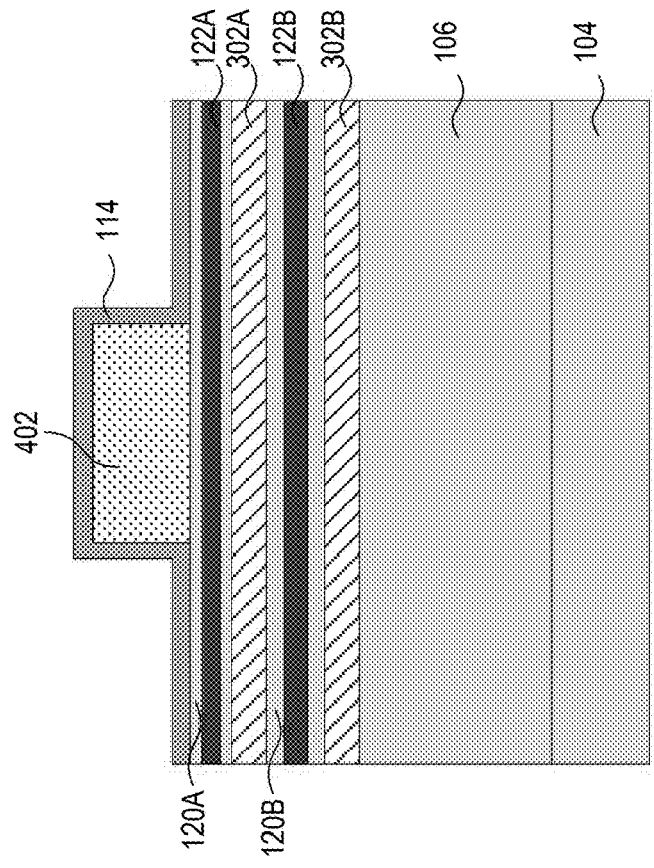

Referring to FIG. 28, in operation 2812, a polysilicon structure is formed on the fin structure and a spacer is formed on the polysilicon structure. For example, as shown in FIG. 31, polysilicon structure 402 is formed on fin structure 106 and spacer 114 is formed on polysilicon structure 402. Polysilicon structure 402 and spacer 114 can be formed in a manner similar to that described with reference to FIG. 4 and operation 204 of FIG. 2.

Figure 32:
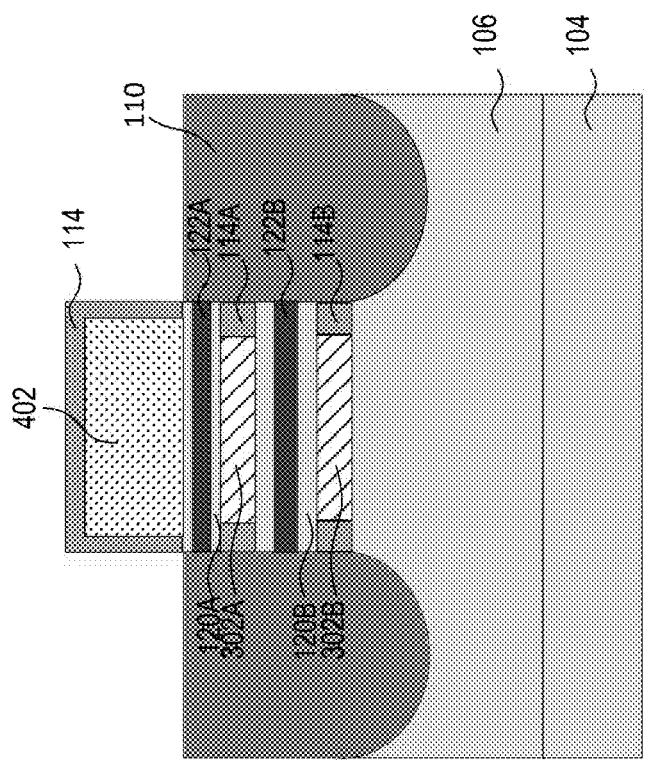

Referring to FIG. 28, in operation 2814, an S/D region is formed on a portion of the fin structure not covered by the polysilicon structure. For example, as shown in FIG. 32, S/D regions 110 are formed on portions of fin structure 106 not covered by polysilicon structure 402. S/D regions 110 can be formed in a manner similar to that described with reference to FIGS. 5-7 and operations 206-210 of FIG. 2. S/D regions 110 can have a dopant that is different from that of counter-doped portions 122A and 122B.

Figure 33:
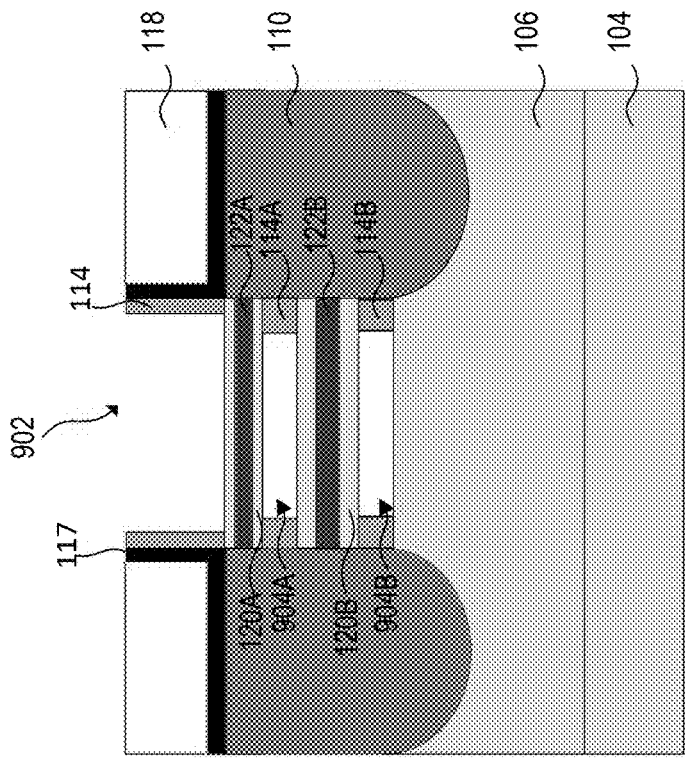

Referring to FIG. 28, in operation 2816, the polysilicon structure and the first-type nanostructures of the fin structure are released. For example, as shown in FIG. 33, polysilicon structure 402 and first-type nanostructures 302A and 302B of fin structure 106 are released. Polysilicon opening 902 and first-type nanostructure openings 904A and 904B are formed. Polysilicon opening 902 and first-type nanostructure openings 904A and 904B can be formed in a manner similar to that described with reference to FIGS. 8 and 9 and operations 212 and 214 of FIG. 2.

Figure 34:
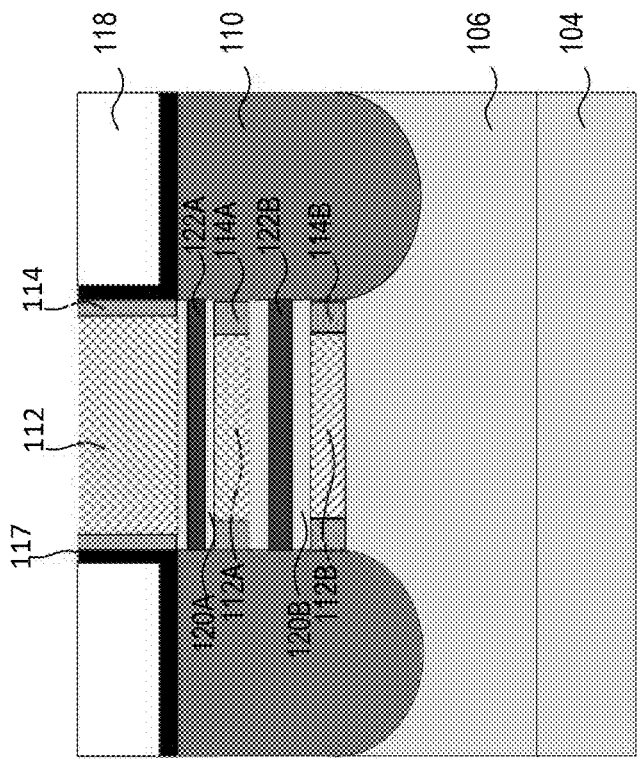

Referring to FIG. 28, in operation 2818, a gate structure is formed in the space released by the polysilicon structure and the first-type nanostructures. For example, as shown in FIG. 34, gate structures 112, 112A, and 112B are formed in polysilicon opening 902 and first-type nanostructure openings 904A and 904B. Gate structures 112, 112A, and 112B can be formed in a manner similar to that described with reference to FIG. 13 and operation 222 of FIG. 2. When gate structures 112, 112A, and 112B are biased at an off state, S/D tunneling can cause leakage current to flow between S/D regions 110. The leakage current can lead to unreliable devices and device failure. Counter-doped portions 122A and 122B can reduce leakage current because counter-doped portions 122A and 122B have the opposite dopant to that of S/D regions 110. Counter-doped portions 122A and 122B can improve device reliability and reduce device failure.

The present disclosure provides example FET devices (e.g., FET 100, GAA FETs, finFETs, horizontal or vertical GAA finFETs, or planar FETs) with counter-doped nanostructures (e.g., counter-doped portions 122A, 122B, and 122C) in a semiconductor device and/or in an IC and example methods (e.g., methods 200, 1400, and 2800) for fabricating the same. In some embodiments, S/D regions (e.g., S/D regions 110) can be formed on opposite sides of a channel region including first-type nanostructures (e.g., first-type nanostructures 302A and 302B) and second-type nanostructures (e.g., second-type nanostructures 120A and 120B). The second-type nanostructures can have the same semiconductor material, such as Si and SiGe, as the S/D regions. The first-type nanostructures can have different semiconductor materials from the second-type nanostructures and the S/D regions. For example, if the second-type nanostructures and the S/D regions include Si, the first-type nanostructures can include SiGe, and vice versa. After first-type nanostructures and a sacrificial polysilicon (e.g., polysilicon structure 402) are released, a plasma doping process can be performed to dope the fin structure and second-type nanostructures via a space released by the first-type nanostructures and the sacrificial polysilicon. After the plasma doping, the second-type nanostructures can have different dopants from the dopants in the S/D regions. For example, if the S/D regions have n-type dopants, such as P and As, the second-type nanostructures can have p-type dopants, such as B, In, Al, and Ga, and vice versa. After the plasma doping, portions of the second-type nanostructures can be removed by wet etching. Additional second-type nanostructures (e.g., additional second-type nanostructures 120A' and 120B' and additional fin structure 120C') can be intrinsic and can be epitaxially grown where the portions of the second-type nanostructures are removed. Therefore, counter-doped portions of the second-type nanostructures can be sandwiched by intrinsic second-type nanostructures. The counter-doped portions of the second-type nanostructures can reduce leakage current. Not all portions of second-type nanostructures are counter-doped because such counter-doping would degrade on current, according to some embodiments.

In some embodiments, the counter-doped portions of the second-type nanostructures can be formed during formation of the fin structure. A first-type nanostructure can be formed on a substrate. An intrinsic first portion of second-type nanostructure can be formed on the first-type nanostructure. An intermediate nanostructure (e.g., intermediate nanostructure 1702) can be formed with a dopant on the first portion. The dopant can be thermally driven (e.g., by annealing) into a top part of the first portion to form a doped second portion of second-type nanostructure. The intermediate nanostructure can then be removed and an intrinsic third portion of second-type nanostructure can be formed on the second portion. S/D regions with an opposite dopant to that of the second portion can be formed on portions of the fin structure, using the second-type nanostructure as a channel region. In some embodiments, after the intrinsic first portion of second-type nanostructure is formed on the first-type nanostructure, a doped second portion of second-type nanostructure can be formed directly on the first portion, and an intrinsic third portion of second-type nanostructure can be formed directly on the second portion. In some embodiments, there is no intermediate nanostructure, and annealing and removal of the intermediate nanostructure are not needed. Both methods can form a second-type nanostructure with a counter-doped portion to reduce leakage current without degrading on current. Both methods can be repeated to form multiple second-type nanostructures.

In some embodiments, a method includes forming a fin structure on a substrate, the fin structure including one or more first-type nanostructures and one or more second-type nanostructures. The method further includes forming a polysilicon structure over the fin structure and forming a source/drain (S/D) region on a portion of the fin structure and adjacent to the polysilicon structure, the S/D region including a first dopant. The method further includes doping the one or more second-type nanostructures with a second dopant via a space released by the polysilicon structure and the one or more first-type nanostructures, where the second dopant is opposite to the first dopant. The method further includes replacing portions of the one or more doped second-type nanostructures with additional second-type nanostructures.

In some embodiments, a method includes forming a fin structure on a substrate. Forming the fin structure includes forming a first-type nanostructure on the substrate, forming a first portion of a second-type nanostructure on the first-type nanostructure, forming a second portion of the second-type nanostructure on the first portion, the second portion including a first dopant, and forming a third portion of the second-type nanostructure on the second portion. The method further includes forming a polysilicon structure over the fin structure and forming a source/drain (S/D) region on a portion of the fin structure and adjacent to the polysilicon structure, the S/D region including a second dopant different from the first dopant. The method further includes forming a gate structure in a space released by the polysilicon structure and the first-type nanostructure.

In some embodiments, a semiconductor device includes a substrate and a fin structure disposed on the substrate, where the fin structure includes one or more nanostructures and one or more gate layers, and where each of the one or more nanostructures includes a first dopant. The semiconductor device further includes a gate structure disposed on the fin structure and a source/drain (S/D) region disposed on a portion of the fin structure and adjacent to the gate structure, the S/D region including a second dopant different from the first dopant. The semiconductor device further includes a spacer interposed between the gate structure and the S/D region, and an inner spacer interposed between each of the one or more gate layers and the S/D region.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin structure on a substrate, the fin structure comprising one or more first-type nanostructures and one or more second-type nanostructures;
   forming a polysilicon structure over the fin structure;
   forming a source/drain (S/D) region on a portion of the fin structure and adjacent to the polysilicon structure, the S/D region comprising a first dopant;
   doping the one or more second-type nanostructures with a second dopant via a space released by the polysilicon structure and the one or more first-type nanostructures, wherein the second dopant is opposite to the first dopant; and
   replacing portions of the one or more doped second-type nanostructures with additional second-type nanostructures.

2. The method of claim 1, further comprising:
   depositing an etch stop layer (ESL) and an interlayer dielectric (ILD) layer to cover the S/D region from being doped with the second dopant.

3. The method of claim 1, wherein doping the one or more second-type nanostructures comprises doping the one or more second-type nanostructures by a plasma doping process.

4. The method of claim 1, wherein replacing portions of the one or more doped second-type nanostructures comprises removing portions of the one or more doped second-type nanostructures by wet etching.

5. The method of claim 1, wherein replacing portions of the one or more second-type nanostructures comprises epitaxially growing the additional second-type nanostructures.

6. The method of claim 1, wherein the one or more second-type nanostructures comprise nanosheets or nanowires.

7. The method of claim 1, wherein a first concentration of the second dopant in a first second-type nanostructure of the one or more second-type nanostructures at a top surface of the fin structure is greater than a second concentration of the second dopant in a second second-type nanostructure of the one or more second-type nanostructures below the top surface of the fin structure.

8. The method of claim 1, further comprising:
forming a gate structure in the space released by the polysilicon structure and the one or more first-type nanostructures, wherein forming the gate structure comprises:
depositing an interfacial oxide (IO) layer;
depositing a high-k (HK) gate dielectric layer;
depositing a work function metal (WFM) layer; and
depositing a gate metal fill layer.

9. The method of claim 1, wherein the second dopant is in a different group of elements from the first dopant.

10. The method of claim 1, wherein the one or more second-type nanostructures comprise a same semiconductor material as the S/D region.

11. A method, comprising:
forming a fin structure comprising first-type nanostructures and second-type nanostructures alternatingly stacking with each other on a substrate;
forming a polysilicon structure over the fin structure;
forming a source/drain (S/D) region on the fin structure and adjacent to the polysilicon structure, wherein the S/D region comprises first-type dopants;
forming openings around the second-type nanostructures;
doping, via the openings, the second-type nanostructures with second-type dopants;
replacing portions of the doped second-type nanostructures by portions of undoped second- type nanostructures; and
forming a gate structure in the openings.

12. The method of claim 11, wherein forming the openings around the second-type nanostructures comprises releasing the polysilicon structure and the first-type nanostructures.

13. The method of claim 11, wherein replacing the portions of the doped second-type nanostructures by the portions of the undoped second-type nanostructures comprises:
removing the portions of the doped second-type nanostructures; and
growing the portions of the undoped second-type nanostructures on remaining portions of the doped second-type nanostructures.

14. The method of claim 11, wherein forming the gate structure comprises forming the gate structure in contact with the portions of the undoped second-type nanostructures.

15. The method of claim 11, wherein the first-type dopants and the second-type dopants are of opposite types.

16. The method of claim 11, wherein the second-type nanostructures comprises a same semiconductor material as the S/D region.

17. A method, comprising:
forming a stack of first-type nanostructures and second-type nanostructures on a substrate;
forming inner spacer structures adjacent to the first-type nanostructures;
removing the first-type nanostructures to expose horizontal surfaces of the second-type nanostructures;
forming doped portions in the second-type nanostructures; and
forming a gate structure surrounding the second type nanostructures.

18. The method of claim 17, wherein forming the doped portions in the second-type nanostructures comprises forming the doped portions surrounded by undoped portions of the second-type nanostructures.

19. The method of claim 17, wherein forming the doped portions in the second-type nanostructures comprises growing undoped portions of the second-type nanostructures on the doped portions.

20. The method of claim 17, wherein forming the doped portions in the second-type nanostructures comprises etching the exposed horizontal surfaces of the second-type nanostructures.

* * * * *

UNITED STATES PATENT AND TRADEMARK OFFICE
CERTIFICATE OF CORRECTION

| | | |
|---|---|---|
| PATENT NO. | : 12,300,718 B2 | Page 1 of 1 |
| APPLICATION NO. | : 17/455240 | |
| DATED | : May 13, 2025 | |
| INVENTOR(S) | : Chang et al. | |

It is certified that error appears in the above-identified patent and that said Letters Patent is hereby corrected as shown below:

In the Claims

In Column 19, Claim 11, Line 44, delete "second- type" and insert -- second-type --, therefor.

Signed and Sealed this
Sixteenth Day of September, 2025

Coke Morgan Stewart
*Acting Director of the United States Patent and Trademark Office*